(12) United States Patent
Huang et al.

(10) Patent No.: US 11,733,613 B2
(45) Date of Patent: Aug. 22, 2023

(54) PREDICTION OF OUT OF SPECIFICATION BASED ON A SPATIAL CHARACTERISTIC OF PROCESS VARIABILITY

(71) Applicant: ASML NETHERLANDS B.V., Veldhoven (NL)

(72) Inventors: Wenjin Huang, San Jose, CA (US); Hongmei Li, San Jose, CA (US); Huina Xu, Tianjin (CN); Bruno La Fontaine, Pleasanton, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 924 days.

(21) Appl. No.: 16/673,350

(22) Filed: Nov. 4, 2019

(65) Prior Publication Data
US 2020/0151600 A1 May 14, 2020

Related U.S. Application Data

(60) Provisional application No. 62/757,397, filed on Nov. 8, 2018.

(51) Int. Cl.
*G03F 7/20* (2006.01)
*G03F 7/00* (2006.01)

(52) U.S. Cl.
CPC .......... *G03F 7/705* (2013.01); *G03F 7/70616* (2013.01)

(58) Field of Classification Search
CPC ...................... G03F 7/705; G03F 7/70; G03F 7/70483–70541; G03F 7/70616–70683; G03F 7/70733; G03F 7/70758; G03F 7/70775; G06N 20/00; G06N 7/01; G06N 3/084

USPC ....... 355/18, 30, 52–55, 67–77, 133; 706/12
See application file for complete search history.

(56) References Cited

U.S. PATENT DOCUMENTS

| | | |
|---|---|---|
| 6,961,116 B2 | 11/2005 | Den Boef et al. |
| 7,587,704 B2 | 9/2009 | Ye et al. |
| 8,200,468 B2 | 6/2012 | Ye et al. |
| 10,990,018 B2 | 4/2021 | Tel et al. |

(Continued)

FOREIGN PATENT DOCUMENTS

| | | |
|---|---|---|
| EP | 3336608 | 6/2018 |
| TW | 201602565 | 1/2016 |

(Continued)

OTHER PUBLICATIONS

Taiwanese Office Action issued in corresponding Taiwanese Patent Application No. 108138978, dated Sep. 29, 2020.

(Continued)

*Primary Examiner* — Christina A Riddle
(74) *Attorney, Agent, or Firm* — Pillsbury Winthrop Shaw Pittman, LLP

(57) ABSTRACT

A method for determining a probabilistic model configured to predict a characteristic (e.g., defects, CD, etc.) of a pattern of a substrate subjected to a patterning process. The method includes obtaining a spatial map of a distribution of a residue corresponding to a characteristic of the pattern on the substrate, determining a zone of the spatial map based on a variation of the distribution of the residue within the spatial map, and determining the probabilistic model based on the zone and the distribution of the residue values or the values of the characteristic of the pattern on the substrate within the zone.

20 Claims, 17 Drawing Sheets

(56) References Cited

U.S. PATENT DOCUMENTS

| | | |
|---|---|---|
| 2006/0066855 A1 | 3/2006 | Den Boef et al. |
| 2007/0031745 A1 | 2/2007 | Ye et al. |
| 2007/0050749 A1 | 3/2007 | Ye et al. |
| 2008/0301620 A1 | 12/2008 | Ye et al. |
| 2008/0309897 A1 | 12/2008 | Wong et al. |
| 2010/0162197 A1 | 6/2010 | Ye et al. |
| 2010/0180251 A1 | 7/2010 | Ye et al. |
| 2011/0027704 A1 | 2/2011 | Cramer et al. |
| 2011/0043791 A1 | 2/2011 | Smilde et al. |
| 2011/0099526 A1 | 4/2011 | Liu |
| 2012/0242970 A1 | 9/2012 | Smilde et al. |
| 2015/0227654 A1* | 8/2015 | Hunsche ............ G03F 7/70525 716/54 |
| 2015/0356233 A1* | 12/2015 | Fouquet ............... G06F 30/398 716/112 |
| 2016/0085905 A1* | 3/2016 | Chen ................ G03F 7/70508 716/52 |
| 2017/0154756 A1 | 6/2017 | Ren et al. |
| 2017/0160074 A1 | 6/2017 | Mossavat et al. |
| 2018/0314149 A1 | 11/2018 | Mulkens |
| 2018/0322237 A1 | 11/2018 | Ten Berge et al. |
| 2019/0094703 A1 | 3/2019 | Jak et al. |
| 2019/0279357 A1* | 9/2019 | Zhong .................. G06F 30/398 |
| 2021/0232748 A1 | 7/2021 | Hsu et al. |

FOREIGN PATENT DOCUMENTS

| | | |
|---|---|---|
| TW | 201734662 | 10/2017 |
| TW | 201820188 | 6/2018 |
| TW | 201830464 | 8/2018 |
| TW | 201835676 | 10/2018 |
| WO | 2009078708 | 6/2009 |
| WO | 2009106279 | 9/2009 |
| WO | 2016128189 | 8/2016 |
| WO | 2016202546 | 12/2016 |
| WO | 2017114662 | 7/2017 |
| WO | 2018015181 | 1/2018 |
| WO | 2018024466 | 2/2018 |
| WO | 2019011604 | 1/2019 |
| WO | 2019115426 | 6/2019 |

OTHER PUBLICATIONS

Office Action issued in corresponding Taiwanese Patent Application No. 110143584, dated Mar. 30, 2023.

\* cited by examiner

PREDICTION OF OUT OF SPECIFICATION BASED ON A SPATIAL CHARACTERISTIC OF PROCESS VARIABILITY

This application claims the benefit of priority of U.S. patent application No. 62/757,397, which was filed on Nov. 8, 2018, and which is incorporated herein in its entirety by reference.

TECHNICAL FIELD

The description herein relates generally to a method to predict physical items that are out of specification, such as out of specification pattern instances on a substrate produced by a device manufacturing process.

BACKGROUND

A lithography apparatus is a machine that applies a desired pattern onto a target portion of a substrate. Lithography apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithography apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

SUMMARY

Whether physical items of a physical system or object (e.g., pattern features on a substrate) are out of specification (e.g., defects) is a significant consideration in, for example, control, modification, design, etc. of a physical item or object or a process involving the physical item or object. Accordingly, there is desired a technique that enables improved prediction of out of specification physical items for, e.g., an improved measurement sampling plan for taking measurements of the physical items (e.g., pattern instances) on a substrate produced by a device manufacturing process).

According to an embodiment, there is provided a method for determining a probabilistic model configured to predict a characteristic of a pattern on a substrate subjected to a patterning process. The method includes obtaining a spatial map of a distribution of a residue corresponding to a characteristic of the pattern on the substrate; determining, via a computing system, a zone of the spatial map based on a variation of the distribution of the residue within the spatial map; and determining, via the computing system, the probabilistic model based on the zone and the distribution of the residue values or the values of the characteristic of the pattern on the substrate within the zone.

In an embodiment, the determining the zone includes determining whether the variation of the distribution of the residue exceeds a predefined threshold; and responsive to the exceeding of the predefined threshold, defining a different zone.

In an embodiment, the determining the zone is an iterative process, wherein a plurality of zones are obtained based on the variation of the distribution of the residue, such that a first zone of the plurality of zones has a first variation of the distribution of the residue, and a second zone of the plurality of zones has a second variation of the distribution of the residue.

In an embodiment, an iteration of the determining the zone includes executing a classification algorithm with the spatial map of the distribution of the residue as input, the classification algorithm providing one or more groups of the residue based on the variation in residue; and identifying a boundary around each group of the one or more groups of residue, wherein the zone is a region within the boundary.

In an embodiment, the iteration of the determining the zone further includes obtaining, via a metrology tool, metrology data in the first zone and the second zone corresponding to the characteristic of the pattern on the substrate, wherein the first zone and the second zone are separated by a first boundary between the first zone and the second zone, and the second zone is identified by a second boundary; and modifying the first boundary around the first zone of the residue based on the metrology data.

In an embodiment, the classification algorithm is a machine learning model trained to identify zones based on the variation of the distribution of the residue or the variation of the characteristic of the pattern on the substrate.

In an embodiment, the classification algorithm involves a clustering analysis based on at least one of: k-nearest mean; mean-shifting; naive-Bayes and back propagation neural network; Density-Based Spatial Clustering of Applications with Noise; Gaussian mixture model; or hierarchical clustering.

In an embodiment, the determining the zone includes determining a radial boundary and an angular span of the radial boundary based on the variation of the distribution of the residue exceeding a predefined threshold in the radial direction, an angular direction or a combination thereof.

In an embodiment, the zone is defined in terms of radial distance from a center of the substrate.

In an embodiment, the zone comprises an irregular closed boundary in a radial direction and spanning a certain angular region of the substrate.

In an embodiment, the determining the probabilistic model includes obtaining values of the characteristic of the pattern on the substrate within the zone; and determining statistical parameters of the probabilistic model based on values of the characteristic of the pattern or values of the residue corresponding to the characteristic of the pattern within the zone.

In an embodiment, the statistical parameters of the probabilistic model comprise a mean and standard deviation values.

In an embodiment, the probabilistic model is a Gaussian distribution.

In an embodiment, the method further includes obtaining, via a metrology tool, additional metrology data corresponding to subsequently processed substrates and distribution of the residues corresponding to the additional data; adjusting, via the computing system, the zone based on the distribution of the residues corresponding to the additional data; and adjusting, via the computing system, the probabilistic model based on the adjusted zone.

In an embodiment, the adjusting of the probabilistic model comprises adjusting a statistical parameter of the probabilistic model to improve accuracy of measurements.

In an embodiment, the method further includes ordering, via the computing system, the plurality of zones from a highest value to a lowest value of the variation of the distribution of the residue within the spatial map; and guiding, via the computing system, the metrology tool to measure a characteristic of a pattern at different locations on a substrate based on the ordered plurality of zones.

In an embodiment, the method further includes determining, via the computing system, the characteristics of the pattern on the substrate that are outside a specification based on the measurements from the metrology tool.

In an embodiment, wherein the characteristic is one or more selected from: a position relative to a substrate, a position relative to one or more other physical item instances, a geometric size, a geometric shape, a measure of a stochastic effect, and/or any combination selected therefrom.

In an embodiment, the method further includes determining, via the computing system, an attribute of the distribution of the residue based on simulation data and measured data corresponding to the characteristic of an ensemble of physical items.

In an embodiment, the attribute of the distribution of the residue with respect to the ensemble of physical items comprises a cumulative distribution function for the ensemble of physical item instances.

In an embodiment, the physical item instance corresponds to a pattern instance on a substrate produced by a device manufacturing process.

In an embodiment, the method further includes determining, based on the probability determined by probabilistic model, or the adjusted probabilistic model, the predicted presence of at least one physical item instance out of specification in a measurement location or field of view of a metrology tool.

In an embodiment, further includes determining, based on the probability determined by probabilistic model, or the adjusted probabilistic model, a sampling plan comprising measurement locations on a substrate for measurements of a characteristic to determine physical item instances, if any, that are out of specification.

Furthermore, according to an embodiment, there is provided a method for determining, for a metrology tool, a sampling plan of a patterning process. The method includes obtaining a probabilistic model corresponding to a zone of a substrate; predicting, via a computing system, a probability using the probabilistic model; and determining, via the computing system, based on the probability, a sampling plan comprising measurement locations on the substrate for measurements of a characteristic to determine whether the substrate is out of specification.

In an embodiment, the method further includes obtaining a spatial map of a distribution of a residue corresponding to a characteristic of a pattern on the substrate; obtaining a plurality of zones of the substrate based on the distribution of the residue and based on a probabilistic model per zone of the plurality of zones; and ordering, via the computing system, the plurality of zones such that a zone of the plurality of zones is arranged a descending order based on associated values of the variation of the distribution of the residue within the spatial map, where the determining of the sampling plan is based on the ordering of the plurality of zones and the probability predicted by the probabilistic model corresponding to a given zone.

In an embodiment, the method further includes guiding, based on the sampling plan, the metrology tool to measure a characteristic of a pattern at different locations on the substrate produced by the patterning process.

In an embodiment, the determining the sampling plan includes obtaining, via the metrology tool, additional metrology data corresponding to subsequently processed substrates and distribution of the residues corresponding to the additional data; adjusting, via the computing system, a given zone of the plurality of zones based on the distribution of the residues corresponding to the additional data; adjusting, via the computing system, the probabilistic model based on the adjusted zone; and adjusting, via the computing system, the sampling plan based on the probability determined by the adjusted probabilistic model.

In an embodiment, the adjusting of the probabilistic model comprises adjusting a statistical parameter of the probabilistic model to improve accuracy of measurements.

Furthermore, according to an embodiment, there is provided a method for determining zones of a substrate based on process variability of a patterning process. The method includes obtaining (i) a spatial map of a distribution of a residue corresponding to a characteristic of a pattern on a substrate, and (ii) a process variation of a parameter of the patterning process; detecting, via a computing system, a relationship between the spatial map of the distribution of the residue and the process variation of the parameter of the patterning process; determining, via the computing system, a zone based on the relationship; and determining, via the computing system, the probabilistic model based on the zone and the distribution of the residue values or the values of the characteristic of the pattern on the substrate within the zone.

In an embodiment, the determining the zone includes determining, based on the relationship, whether the process variation of the parameter of the patterning process causes a change in the distribution of the residue to exceed a predefined threshold; and responsive to the exceeding of the predefined threshold, defining a different zone.

In an embodiment, the parameter of the patterning process is at least one of dose, focus, an optical parameter, or moving standard deviation of movement of the substrate.

Furthermore, according to an embodiment, there is provided a computer program product comprising a non-transitory computer readable medium having instructions recorded thereon, the instructions when executed by a computer system implementing the methods above.

BRIEF DESCRIPTION OF THE DRAWINGS

The above aspects and other aspects and features will become apparent to those ordinarily skilled in the art upon review of the following description of specific embodiments in conjunction with the accompanying figures, wherein.

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, there is no intention for any term in the specification or claims to be ascribed an uncommon or special meaning unless explicitly set forth as such. Further, the scope encompasses present and future known equivalents to the components referred to herein by way of illustration.

DETAILED DESCRIPTION

Before describing embodiments in detail, it is instructive to present an example environment in which embodiments may be implemented.

Figure 1:
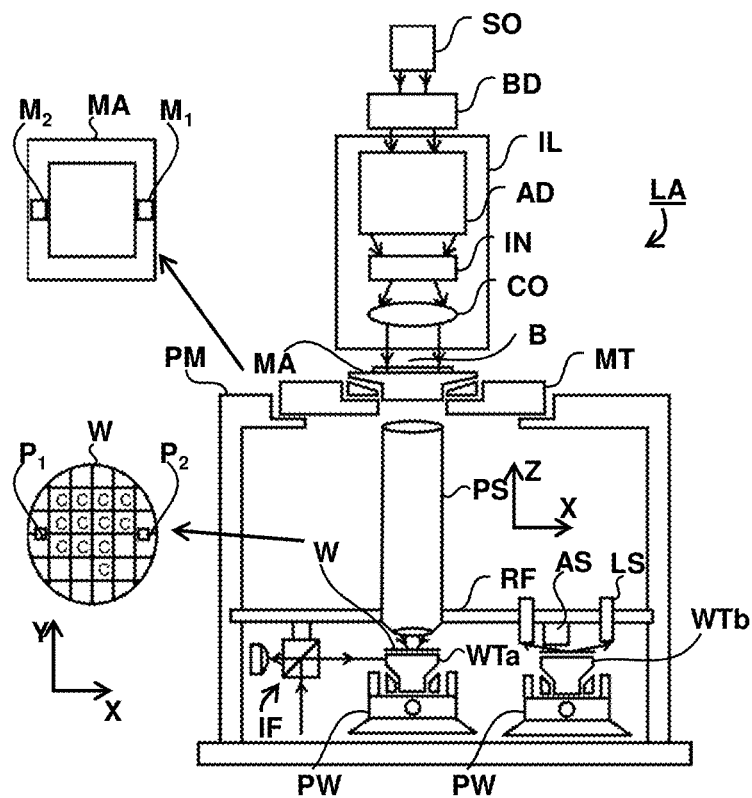
FIG. 1 schematically depicts a lithography apparatus according to an embodiment.

FIG. 1 schematically depicts an embodiment of a lithographic apparatus LA. The apparatus comprises:
an illumination system (illuminator) IL configured to condition a radiation beam B (e.g. ultraviolet (UV) radiation or deep ultraviolet (DUV) radiation);
a support structure (e.g. a mask table) MT constructed to support a patterning device (e.g. a mask) MA and connected to a first positioner PM configured to accurately position the patterning device in accordance with certain parameters;
a substrate table (e.g. a wafer table) WT (e.g., WTa, WTb or both) constructed to hold a substrate (e.g. a resist-coated wafer) W and connected to a second positioner PW configured to accurately position the substrate in accordance with certain parameters; and
a projection system (e.g. a refractive projection lens system) PS configured to project a pattern imparted to the radiation beam B by patterning device MA onto a target portion C (e.g. comprising one or more dies and often referred to as fields) of the substrate W, the projection system supported on a reference frame (RF).

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors or a beam expander. In other cases the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

So, the illuminator IL may comprise adjuster AM configured to adjust the (angular/spatial) intensity distribution of the beam. Generally, at least the outer or inner radial extent (commonly referred to as σ-outer and σ-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable alter the polarization of the beam and may be operable to adjust the polarization using adjuster AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illumination system may include various types of optical components, such as refractive, reflective, magnetic, electromagnetic, electrostatic or other types of optical components, or any combination thereof, for directing, shaping, or controlling radiation.

Thus, the illuminator provides a conditioned beam of radiation B, having a desired uniformity and intensity distribution in its cross section.

The support structure MT supports the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

A patterning device may be transmissive or reflective. Examples of patterning devices include masks, programmable mirror arrays, and programmable liquid-crystal display (LCD) panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism AM configured to adjust one or more of the optical elements so as to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; or deform one or more optical elements. Displacement of an optical element may be in any direction (x, y, z or a combination thereof). Tilting of an optical element is typically out of a plane perpendicular to the optical axis, by rotating about an axis in the x or y directions although a rotation about the z axis may be used for a non-rotationally symmetric aspherical optical element. Deformation of an optical element may include a low frequency shape (e.g. astigmatic) or a high frequency shape (e.g. free form aspheres). Deformation of an optical element may be performed for example by using one or more actuators to exert force on one or more sides of the optical element or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, or cleaning, etc.). In such "multiple stage" machines the additional tables may be used in parallel, or preparatory steps may be carried out on one or more tables while one or more other tables are being used for exposure. For example, alignment measurements using an alignment sensor AS or level (height, tilt, etc.) measurements using a level sensor LS may be made.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

So, in operation of the lithographic apparatus, a radiation beam is conditioned and provided by the illumination system IL. The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations or variations on the above described modes of use or entirely different modes of use may also be employed.

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

Various patterns on or provided by a patterning device may have different process windows. i.e., a space of processing variables under which a pattern will be produced within specification. Examples of pattern specifications that relate to potential systematic defects include checks for necking, line pull back, line thinning, critical dimension (CD), edge placement, overlapping, resist top loss, resist undercut or bridging. The process window of all the patterns on a patterning device or an area thereof may be obtained by merging (e.g., overlapping) process windows of each individual pattern. The boundary of the process window of all the patterns contains boundaries of process windows of some of the individual patterns. In other words, these individual patterns limit the process window of all the patterns. These patterns can be referred to as "hot spots" or "process window limiting patterns (PWLPs)," which are used interchangeably herein. When controlling a part of a patterning process, it is possible and economical to focus on the hot spots. When the hot spots are not defective, it is most likely that all the patterns are not defective.

Figure 2:
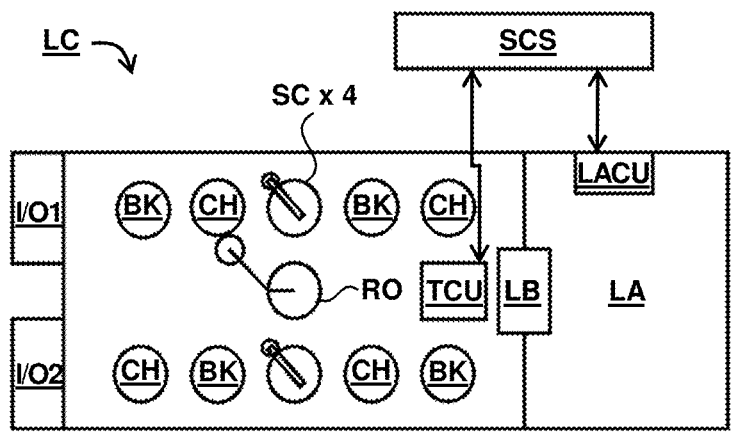
FIG. 2 schematically depicts an embodiment of a lithographic cell or cluster according to an embodiment.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently or in order to monitor a part of the patterning process (e.g., a device manufacturing process) that includes at least one pattern transfer step (e.g., an optical lithography step), it is desirable to inspect a substrate or other object to measure or determine one or more properties such as alignment, overlay (which can be, for example, between structures in overlying layers or between structures in a same layer that have been provided separately to the layer by, for example, a double patterning process), line thickness, critical dimension (CD), focus offset, a material property, etc. Accordingly a manufacturing facility in which lithocell LC is located also typically includes a metrology system MET which measures some or all of the substrates W that have been processed in the lithocell or other objects in the lithocell. The metrology system MET may be part of the lithocell LC, for example it may be part of the lithographic apparatus LA (such as alignment sensor AS).

The one or more measured parameters may include, for example, overlay between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself or on a dedicated metrology target provided on the substrate. The measurement can be performed after-development of a resist but before etching or can be performed after-etch.

There are various techniques for making measurements of the structures formed in the patterning process, including the use of a scanning electron microscope, an image-based measurement tool or various specialized tools. As discussed above, a fast and non-invasive form of specialized metrology tool is one in which a beam of radiation is directed onto a target on the surface of the substrate and properties of the scattered (diffracted/reflected) beam are measured. By evaluating one or more properties of the radiation scattered by the substrate, one or more properties of the substrate can be determined. This may be termed diffraction-based metrology. One such application of this diffraction-based metrology is in the measurement of feature asymmetry within a target. This can be used as a measure of overlay, for example, but other applications are also known. For example, asymmetry can be measured by comparing opposite parts of the diffraction spectrum (for example, comparing the −1st and +1st orders in the diffraction spectrum of a periodic grating). This can be done as described above and as described, for example, in U.S. patent application publication US 2006-066855, which is incorporated herein in its entirety by reference. Another application of diffraction-based metrology is in the measurement of feature width (CD) within a target. Such techniques can use the apparatus and methods described hereafter.

Thus, in a device fabrication process (e.g., a patterning process or a lithography process), a substrate or other objects may be subjected to various types of measurement during or after the process. The measurement may determine whether a particular substrate is defective, may establish adjustments to the process and apparatuses used in the process (e.g., aligning two layers on the substrate or aligning the patterning device to the substrate), may measure the performance of the process and the apparatuses, or may be for other purposes. Examples of measurement include optical imaging (e.g., optical microscope), non-imaging optical measurement (e.g., measurement based on diffraction such as ASML YieldStar metrology tool, ASML SMASH metrology system), mechanical measurement (e.g., profiling using a stylus, atomic force microscopy (AFM)), or non-optical imaging (e.g., scanning electron microscopy (SEM)). The SMASH (SMart Alignment Sensor Hybrid) system, as described in U.S. Pat. No. 6,961,116, which is incorporated by reference herein in its entirety, employs a self-referencing interferometer that produces two overlapping and relatively rotated images of an alignment marker, detects intensities in a pupil plane where Fourier transforms of the images are caused to interfere, and extracts the positional information from the phase difference between diffraction orders of the two images which manifests as intensity variations in the interfered orders.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which are good.

Within a metrology system MET, a metrology apparatus is used to determine one or more properties of the substrate, and in particular, how one or more properties of different substrates vary or different layers of the same substrate vary from layer to layer. As noted above, the metrology apparatus may be integrated into the lithographic apparatus LA or the lithocell LC or may be a stand-alone device.

To enable the metrology, one or more targets can be provided on the substrate. In an embodiment, the target is specially designed and may comprise a periodic structure. In an embodiment, the target is a part of a device pattern, e.g., a periodic structure of the device pattern. In an embodiment, the device pattern is a periodic structure of a memory device (e.g., a Bipolar Transistor (BPT), a Bit Line Contact (BLC), etc. structure).

In an embodiment, the target on a substrate may comprise one or more 1-D periodic structures (e.g., gratings), which are printed such that after development, the periodic structural features are formed of solid resist lines. In an embodiment, the target may comprise one or more 2-D periodic structures (e.g., gratings), which are printed such that after development, the one or more periodic structures are formed of solid resist pillars or vias in the resist. The bars, pillars or vias may alternatively be etched into the substrate (e.g., into one or more layers on the substrate).

In an embodiment, one of the parameters of interest of a patterning process is overlay. Overlay can be measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011-0027704, US2011-0043791 and US2012-0242970, which are hereby incorporated in their entirety by reference. Diffraction-based overlay using dark-field detection of the diffraction orders enables overlay measurements on smaller targets. These targets can be smaller than the illumination spot and may be surrounded by device product structures on a substrate. In an embodiment, multiple targets can be measured in one radiation capture.

Figure 3:
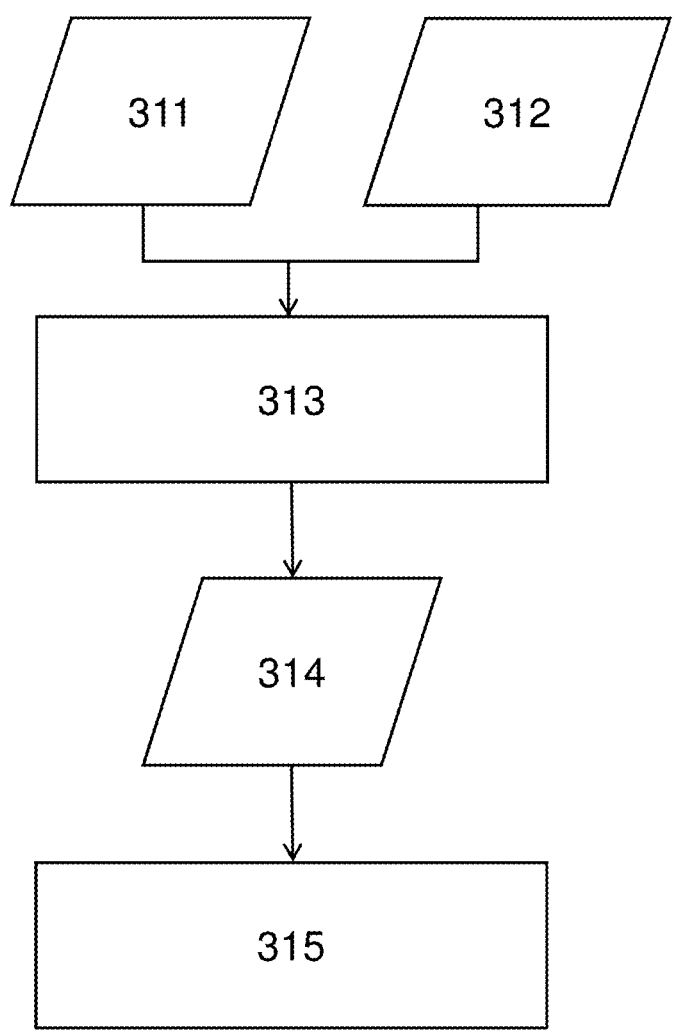
FIG. 3 schematically depicts a method of predicting defects in a device manufacturing process according to an embodiment.

FIG. 3 schematically depicts a method of predicting defects in a device manufacturing process. Examples of a defect can include necking, line-end pull back, line thinning, incorrect CD, overlapping, bridging and/or others. A defect can be in a resist image, an optical image or an etch image (i.e., a pattern transferred to a layer of the substrate by etching using the resist thereon as a mask). At 313, a model is used to compute a characteristic 314 (e.g., the existence, location, type, shape, etc.) of a pattern, based on one or more process parameters 311 of the device manufacturing process and/or one or more layout parameters 312. The process parameters 311 are parameters associated with the device manufacturing process but not with the layout. For example, the process parameters 311 may include a characteristic of the illumination (e.g., intensity, pupil profile, etc.), a characteristic of the projection optics, dose, focus, a characteristic of the resist, a characteristic of development of the resist, a characteristic of post-exposure baking of the resist, and/or a characteristic of etching. The layout parameters 312 may include a shape, size, relative location, and/or absolute location of various features on a layout, and/or overlapping of features on different layouts. In an example, the model is an empirical model, where the pattern, which can be in a resist image, aerial image, or etch image, is not simulated; instead, the empirical model determines the characteristic 314 (e.g., the existence, location, type, shape, etc.) of the pattern based on a correlation between the input (e.g., the one or more process parameters 311 and/or layout parameters 312) of the empirical model and the characteristic. In an example, the model is a computational model, where at least a portion of the pattern is simulated and the characteristic 314 is determined from the portion, or the characteristic 314 is simulated without simulating the pattern itself. At 315, whether the pattern is a defect or whether there is a probability that the pattern is a defect is determined based on the characteristic 314. For example, a line-end pull back defect may be identified by finding a line end too far away from its desired location; a bridging defect may be identified by finding a location where two lines undesirably join.

Examples of applicable computational methods are described in U.S. patent application publication no. US 2015-0227654, PCT patent application publication no. WO 2016-128189, PCT patent application publication no. WO 2016-202546, PCT patent application publication no. WO 2017-114662 and PCT patent application publ. no. WO 2018-015181, each of which is incorporated herein in its entirety by reference.

In an embodiment, the model can be in the form of a polynomial comprising, as variables, one or more process parameters of the device manufacturing process. For example, the polynomial can be characterized in terms of one or more selected from: focus, dose, a moving average (MA) of lithographic apparatus table servo error, moving standard deviation (MSD) of a lithographic apparatus table servo error, a patterning device pattern error, and/or an etch parameter. In an embodiment, one or more variables can be characterized spatially (e.g., with X and Y coordinates, with radial coordinates, etc.) across the substrate. As an example, the polynomial can be specified in terms of at least focus and dose, wherein the focus and dose is spatially characterized across the substrate.

Figure 4:
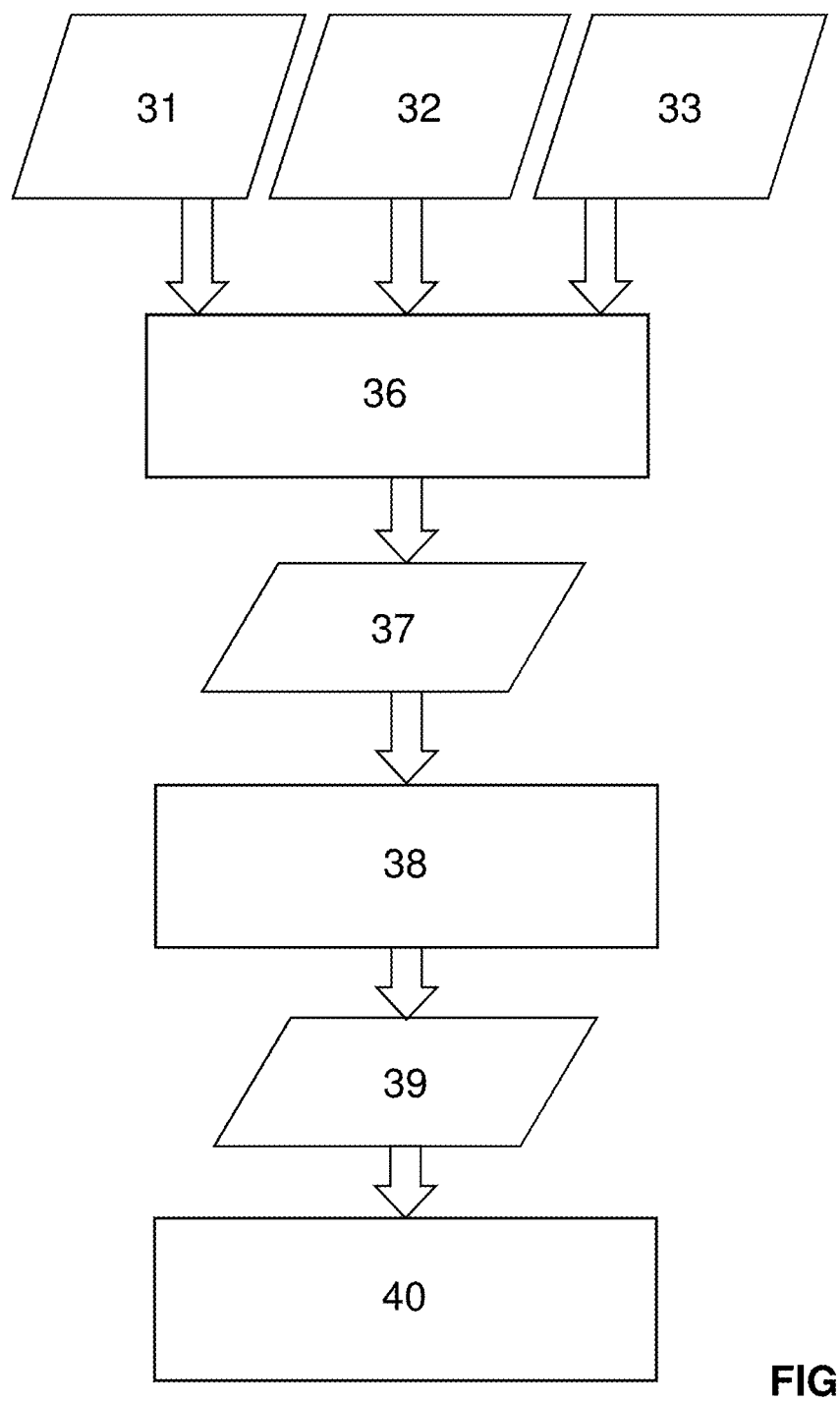
FIG. 4 illustrates a flowchart for a method of simulating at least a portion of a pattern or a characteristic of a pattern in an image according to an embodiment.

An exemplary flow chart of a method of modelling and/or simulating parts of a patterning process is illustrated in FIG. 4, for example, modelling and/or simulating at least a portion of a pattern or a characteristic of a pattern in an image (e.g., resist image, aerial image, etch image). As will be appreciated, the models may represent a different patterning process and need not comprise all the models described below.

As described above, in a lithographic projection apparatus, an illumination system provides illumination (i.e. radiation) to patterning device and projection optics directs the illumination from the patterning device onto a substrate. So, in an embodiment, the projection optics enables the formation of an aerial image (AI), which is the radiation intensity distribution at the substrate. A resist layer on the substrate is exposed and the aerial image is transferred to the resist layer as a latent "resist image" (RI) therein. The resist image (RI) can be defined as a spatial distribution of solubility of the resist in the resist layer. In an embodiment, simulation of a lithography process can simulate the production of the aerial image and/or resist image.

An illumination model 31 represents optical characteristics (including radiation intensity distribution and/or phase distribution) of an illumination mode used to generate a patterned radiation beam. The illumination model 31 can represent the optical characteristics of the illumination that include, but not limited to, numerical aperture settings, illumination sigma (σ) settings as well as any particular illumination mode shape (e.g. off-axis radiation shape such as annular, quadrupole, dipole, etc.), where σ (or sigma) is outer radial extent of the illuminator.

A projection optics model 32 represents optical characteristics (including changes to the radiation intensity distribution and/or the phase distribution caused by the projection optics) of the projection optics. The projection optics model 32 may include optical aberrations caused by various factors, for example, heating of the components of the projection optics, stress caused by mechanical connections of the components of the projection optics, etc. The projection optics model 32 can represent the optical characteristics of the projection optics, including one or more selected from: an aberration, a distortion, a refractive index, a physical size, a physical dimension, an absorption, etc. Optical properties of the lithographic projection apparatus (e.g., properties of the illumination, the patterning device pattern and the projection optics) dictate the aerial image. Since the patterning device pattern used in the lithographic projection apparatus can be changed, it is desirable to separate the optical properties of the patterning device pattern from the optical properties of the rest of the lithographic projection apparatus including at least the illumination and the projection optics. The illumination model 31 and the projection optics model 32 can be combined into a transmission cross coefficient (TCC) model.

A patterning device pattern model 33 represents optical characteristics (including changes to the radiation intensity distribution and/or the phase distribution caused by a given patterning device pattern) of a patterning device pattern (e.g., a device design layout corresponding to a feature of an integrated circuit, a memory, an electronic device, etc.), which is the representation of an arrangement of features on or formed by a patterning device. The patterning device model 33 captures how the design features are laid out in the pattern of the patterning device and may include a representation of detailed physical properties of the patterning device and a patterning device pattern, as described, for example, in U.S. Pat. No. 7,587,704, which is incorporated herein in its entirety by reference.

A resist model 37 can be used to calculate the resist image from the aerial image. An example of such a resist model can be found in U.S. Pat. No. 8,200,468, which is hereby incorporated by reference in its entirety. The resist model typically describes the effects of chemical processes which occur during resist exposure, post exposure bake (PEB) and development, in order to predict, for example, contours of resist features formed on the substrate and so it typically is related only to such properties of the resist layer (e.g., effects of chemical processes which occur during exposure, post-exposure bake and development). In an embodiment, the optical properties of the resist layer, e.g., refractive index, film thickness, propagation and polarization effects—may be captured as part of the projection optics model 32.

Having these models, an aerial image 36 can be simulated from the illumination model 31, the projection optics model 32 and the patterning device pattern model 33. An aerial image (AI) is the radiation intensity distribution at substrate level. Optical properties of the lithographic projection apparatus (e.g., properties of the illumination, the patterning device and the projection optics) dictate the aerial image.

As noted above, a resist layer on a substrate is exposed by the aerial image and the aerial image is transferred to the resist layer as a latent "resist image" (RI) therein. A resist image 38 can be simulated from the aerial image 36 using a resist model 37. So, in general, the connection between the optical and the resist model is a simulated aerial image intensity within the resist layer, which arises from the projection of radiation onto the substrate, refraction at the resist interface and multiple reflections in the resist film stack. The radiation intensity distribution (aerial image intensity) is turned into a latent "resist image" by absorption of incident energy, which is further modified by diffusion processes and various loading effects. Efficient simulation methods that are fast enough for full-chip applications approximate the realistic 3-dimensional intensity distribution in the resist stack by a 2-dimensional aerial (and resist) image.

In an embodiment, the resist image can be used as an input to a post-pattern transfer process model 39. The post-pattern transfer process model 39 defines performance of one or more post-resist development processes (e.g., etch, CMP, etc.) and can produce a post-etch image 40. That is, an etch image 40 can be simulated from the resist image 38 using a post-pattern transfer process model 39.

Thus, this model formulation describes most, if not all, of the known physics and chemistry of the overall process, and each of the model parameters desirably corresponds to a distinct physical or chemical effect. The model formulation thus sets an upper bound on how well the model can be used to simulate the overall manufacturing process.

Simulation of the patterning process can, for example, predict contours, CDs, edge placement (e.g., edge placement error), pattern shift, etc. in the aerial, resist and/or etch image. That is, the aerial image 36, the resist image 38 or the etch image 40 may be used to determine a characteristic (e.g., the existence, location, type, shape, etc. of) of a pattern. Thus, the objective of the simulation is to accurately predict, for example, edge placement, and/or contours, and/or pattern shift, and/or aerial image intensity slope, and/or CD, etc. of the printed pattern. These values can be compared against an intended design to, e.g., correct the patterning process, identify where a defect is predicted to occur, etc. The intended design is generally defined as a pre-OPC design layout which can be provided in a standardized digital file format such as GDSII or OASIS or other file format.

Details of techniques and models used to transform a patterning device pattern into various lithographic images (e.g., an aerial image, a resist image, etc.), apply OPC using those techniques and models and evaluate performance (e.g., in terms of process window) are described in U.S. Patent Application Publication Nos. US 2008-0301620, 2007-0050749, 2007-0031745, 2008-0309897, 2010-0162197, 2010-0180251 and 2011-0099526, the disclosure of each which is hereby incorporated by reference in its entirety.

To facilitate the speed of evaluating the models, from the patterning device pattern, one or more portions may be identified, which are referred to as "clips." In a specific embodiment, a set of clips is extracted, which represents the complicated patterns in the patterning device pattern (typically about 50 to 1000 clips, although any number of clips may be used). As will be appreciated by those skilled in the art, these patterns or clips represent small portions (i.e. circuits, cells or patterns) of the design and especially the clips represent small portions for which particular attention and/or verification is needed. In other words, clips may be the portions of the patterning device pattern or may be similar or have a similar behavior of portions of the patterning device pattern where critical features are identified either by experience (including clips provided by a customer), by trial and error, or by running a full-chip simulation. Clips usually contain one or more test patterns or gauge patterns. An initial larger set of clips may be provided a priori by a customer based on known critical feature areas in a patterning device pattern which require particular consideration. In an embodiment, the initial larger set of clips may be extracted from the entire patterning device pattern by using some kind of automated (such as, machine vision) or manual algorithm that identifies the critical feature areas.

Furthermore, various patterns on or provided by a patterning device may have different process windows. i.e., a space of processing variables under which a pattern will be produced within specification. Examples of pattern specifications that relate to potential systematic defects include checks for necking, line-end pull back, line thinning, CD, edge placement, overlapping, resist top loss, resist undercut and/or bridging. The process window of all the patterns on a patterning device or an area thereof may be obtained by merging (e.g., overlapping) process windows of each individual pattern. The boundary of the process window of all the patterns contains boundaries of process windows of some of the individual patterns. In other words, these individual patterns limit the process window of all the patterns. These patterns can be referred to as "hot spots" or "process window limiting patterns (PWLPs)," which are used interchangeably herein. When designing, modifying, etc. a part of a patterning process using, for example, the modeling described herein, it is possible and economical to focus on the hot spots. When the hot spots are not defective, it is most likely that all the patterns are not defective.

So, a current approach to identifying actual defects on substrates based on relatively fast optical inspection can run into resolution problems in trying to detect small defects (e.g., sub-10 nm defects). On the other hand, e-beam systems are typically too slow to be used in high-volume manufacturing (HVM) to inspect a high number of locations for defects. So, as described above, computational methods can be used to help identify locations where defects should be located on substrates and then guiding an e-beam inspection (EBI) tool to those locations. This can increase the effective inspection speed of EBI and making it useful for finding small defects (e.g., sub-10 nm defects) in HVM.

Of course, the effectiveness of using a computational method to identify potential defects to improve the inspection speed depends on the model used to guide the EBI tool to relevant defect locations with high accuracy. But a problem faced by such computational methods in finding small defects (e.g., sub-10 nm defects) is that the modelling used to identify defect locations cannot predict perfectly how patterns will be produced on product substrates. As a result, there is a model residual, namely a difference between the predicted size of a pattern and that as measured.

These model residuals (e.g., noise) can be commensurate in size with the small defects that the computational methods attempt to predict. This results in significant uncertainty about whether a defect will or will not manifest itself at the predicted locations. So, to reach an acceptable level of certainty of finding all defects on a substrate during inspection, the EBI tool should visit all the locations that the computational method indicates that there is a fair chance that a defect is present; that is the thresholding used to identify defects may need to be wider than optimal in order to be sure to capture all, or most, defects. This means that the EBI tool will have to inspect a sizeable number of unnecessary locations (nuisance) in order to capture the real defects. This is likely to result in unnecessary inspection time and poor correlation between the number of points measured and the actual number of defects. That is, for example, the number of points that would need to be sampled on any given substrate to ascertain the actual number of defects is significantly larger than the actual number of defects and its ratio to the actual number of defects on any given substrate is not necessarily a constant. So, the inspection time can be significantly longer than needed.

Now, although random variations are random, their statistics may not be. Therefore, predicting defects statistically, in other words, predicting the probabilities of defects, may be possible. Accordingly, in an embodiment, a probabilistic model or method, i.e., a model or method that computes a probability of the characteristic of defects having a certain value, is used at 313 of FIG. 3. For example, the probabilistic model or method can predict the probability that a pattern in an image has a certain shape or a certain CD. A probabilistic model or method may better capture random variations in the device manufacturing process than only use of a non-probabilistic model.

Examples of probabilistic model are discussed in PCT patent application publication numbers WO 2019-011604 and WO 2019-115426, each of which is incorporated herein in its entirety by reference. Specifically, the methods in the aforementioned US applications involve adding a probabilistic model based on the statistics of a characteristic (e.g., CD, hotspots) measured on a substrate (interchangeably referred to as wafer) and allowing for two different concentric zones on which these statistics are collected on the substrate. However, this limits the usefulness of the probabilistic model to a predefined (i.e. not adaptable) substrate distribution of the characteristic (e.g., hotspots). Such probabilistic model may result in a higher sampling count (and thus longer inspection time) for finding more than 90% of the defects on a substrate.

The present disclosure provides methods and probabilistic model that allows the probabilistic model to be based on statistics that are adapted to the substrate spatial-characteristics of the characteristic (e.g., hotspots) response to the patterning process.

Figure 5:
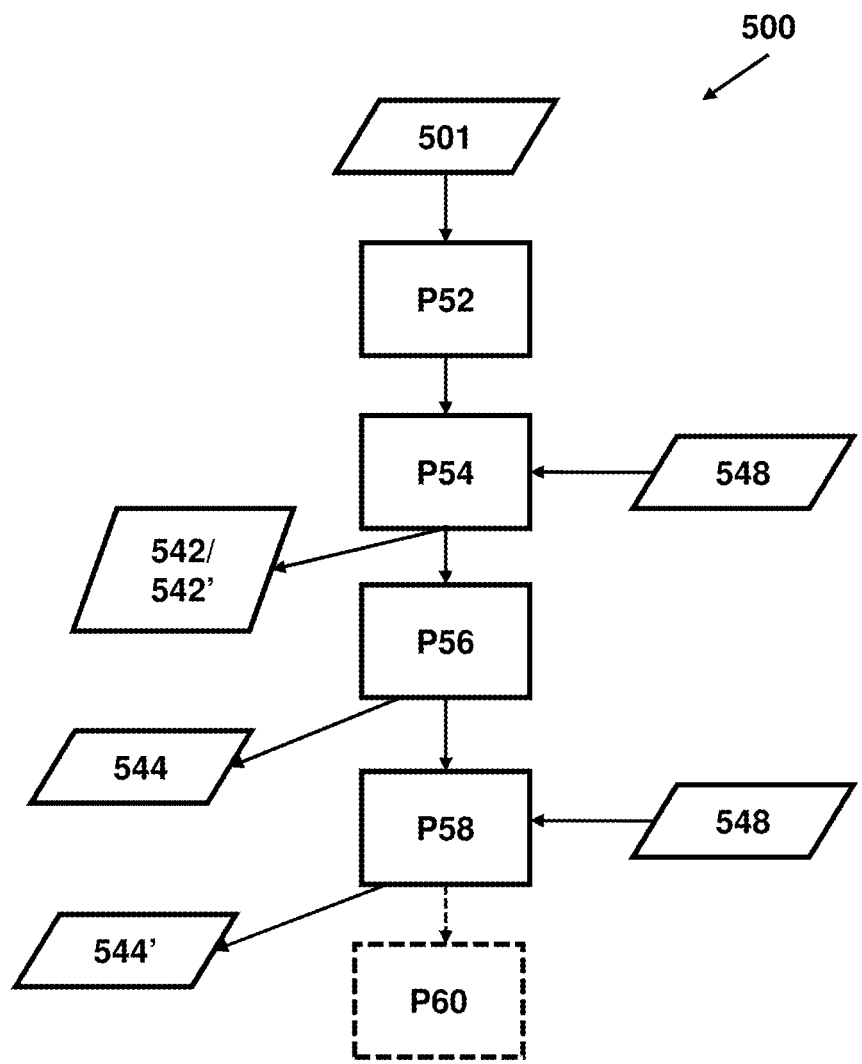
FIG. 5 is a flow chart of a method for determining a probabilistic model configured to predict a characteristic of a patterning process according to an embodiment.

FIG. 5 is a flow chart of a method 500 for determining a probabilistic model configured to predict a characteristic of a pattern on a substrate subjected to a patterning process. According to the method 500, a probabilistic model is configured to predict a characteristic of a substrate such as a probability of a defect at a particular location on the substrate, hotspots, CD, etc. In an embodiment, the probabilistic model is developed based on spatial-characteristics of the substrate such as spatial characteristics of hotspots. Such characteristics relates to a distribution of a residue (e.g., a difference between predicted and measured characteristics of a substrate) across the substrate. There may be a significant variation in the distribution of the residue across the substrate, as such the probabilistic model is defined per zone of the substrate. A zone is a region of on a substrate having a particular variation in residue. Thus, according to an embodiment, a substrate may be divided into a plurality of zones, each zone associated with a probabilistic model. Furthermore, the probabilistic model may be adapted or modified based on additional data related to a desired characteristic of a substrate or patterns thereon obtained from subsequently processed substrates. For example, based on the additional data the zones of the substrate may be redefined and thereby the corresponding probabilistic model per zone may correspondingly be redefined.

Thus, based on the location being measured, appropriate probabilistic model may be selected resulting in more accurate predictions of defects, which in turn can be used to guide the metrology tool for making measurements. The method 500 is discussed in more detail hereinafter.

The method 500, in process P52, involves obtaining a spatial map 501 of a distribution of a residue corresponding to the characteristic of the substrate. In an embodiment, there is a difference between a computed value of a characteristic of the pattern (e.g., obtained by simulation of a process model which may be a non-probabilistic model, a physics-based model, empirical model, etc.) and an actual value of the characteristic of the pattern as produced by the patterning process. This difference is called a residue. The residue may be attributed to, for example, random variations, imperfection of the non-probabilistic model, an input of the non-probabilistic model, or a combination thereof.

In practice, the residue may have a distribution (e.g., distribution 611 in FIG. 6, and distributions 852 and 862 in FIGS. 8A and 8C) characterized, for example, in term of the number of instances of the occurrence of residue values, in terms of probabilities of the occurrence of the residue values, etc. For example, a particular pattern may in practice be produced at different sizes across a substrate, but the predicted size of those pattern instances across the substrate could be the same or be predicted with a different variation than the actual produced sizes. Accordingly, there would be a distribution of the residue values.

In an embodiment, an attribute of the distribution of the residue may be obtained. In an embodiment, an attribute is one that represents the spread of the distribution (e.g., variance and/or standard deviation). In an embodiment, the attribute is for a particular pattern type or collection of pattern types. In an embodiment, the attribute is for a particular hotspot or a collection of hotspots. As will be appreciated, a plurality of different attributes can be obtained, each corresponding to a different pattern type or collection of pattern types.

One example of the attribute is a probability density function (PDF) of the residue. In an embodiment, the PDF can be normalized so that the sum of the probabilities under the distribution is a particular value, e.g., 1. A further example of the attribute is a cumulative distribution function (CDF) of the residue or an empirical cumulative distribution function (eCDF) (also called an empirical distribution function (EDF)). The eCDF may be determined from the values of the residue. An eCDF is the distribution function associated with the empirical measure of a sample (e.g., the values of the residue obtained from a plurality of pattern instances as discussed below). The eCDF is a step function. The eCDF may be defined using the following formula:

$$\hat{F}(t) = \frac{1}{n}\sum_{i=1}^{n} I_{x_i \leq t},$$

where $(x_1, \ldots, x_n)$ are the values in the sample, and $I_A$ is an indicator function of event A. The value of the eCDF $\hat{F}(t)$ at any specified value t is the fraction of the sample that is less than or equal to t. It converges with probability 1 to that underlying distribution with increasing n, according to the Glivenko-Cantelli theorem. The CDF may be estimated based on an eCDF. For example, the CDF F(t) may be estimated based on the eCDF $\hat{F}(t)$ using, for example, the Dvorestzky-Kiefer-Wolfowitz (DKW) inequality. The estimation error E of the CDF based on the eCDF is bounded by the DKW inequality:

$$\mathbb{P}\left\{\sup_t |F(t) - \hat{F}(t)| > \epsilon\right\} \leq 2e^{-2n\epsilon^2}.$$

The DKW inequality shows that the estimation error $\in$ may be determined by the number of the values of the residue n used to construct the eCDF $\hat{F}(t)$.

A spatial map refers to a distribution of the residue across the substrate. In an embodiment, each location on the spatial map may have a particular distribution of the residue. For example, a center of the substrate may have a residue with a relatively low variation (e.g., lowest variation) and another portion such as a part of an edge of substrate may have residue with relatively high variation (e.g., highest variation). FIG. 7 illustrate an example spatial map 730, where a spatial map 730 of the distribution 733 of the residue includes locations such as 733a, 733b, 733c having a first variation (e.g., highest variation relative to other locations), and locations 733d having a second variation (e.g., less than the first variation) of residue. In an embodiment, the first set of locations having a first (larger) variation may be grouped into one statistical sample describing a first particular area or plurality of areas on the wafer, whereas a second set of locations having a second (smaller) variation may be grouped into one statistical sample describing a second particular area or plurality of areas on the wafer. In an embodiment, the spatial map 501 of the residue may be obtained, for example, as discussed in FIG. 5. In FIG. 6, a spatial map 630 includes the distribution of the residue corresponding to a characteristic (e.g., CD) of a pattern on the substrate.

A characteristic of a substrate refers to a value of a characteristic of a pattern on the substrate. The characteristic of the substrate may be determined based on simulation of the patterning process or based on measurement obtained from a metrology tool. In an embodiment, a non-probabilistic model may be defined to predict the characteristic of the substrate. A non-exhaustive list of examples of the characteristic may include one or more selected from: position relative to the substrate, position relative to one or more other pattern instances on the substrate, a geometric size (e.g., a CD), a geometric shape, and/or a measure of a stochastic effect (e.g., CD uniformity (CDU), line width roughness (LWR), etc.). In an embodiment, the value is calculated for a type of pattern for which there is an attribute (e.g., it matches the pattern type for the attribute or matches to a collection of pattern types for the attribute).

Figure 9:
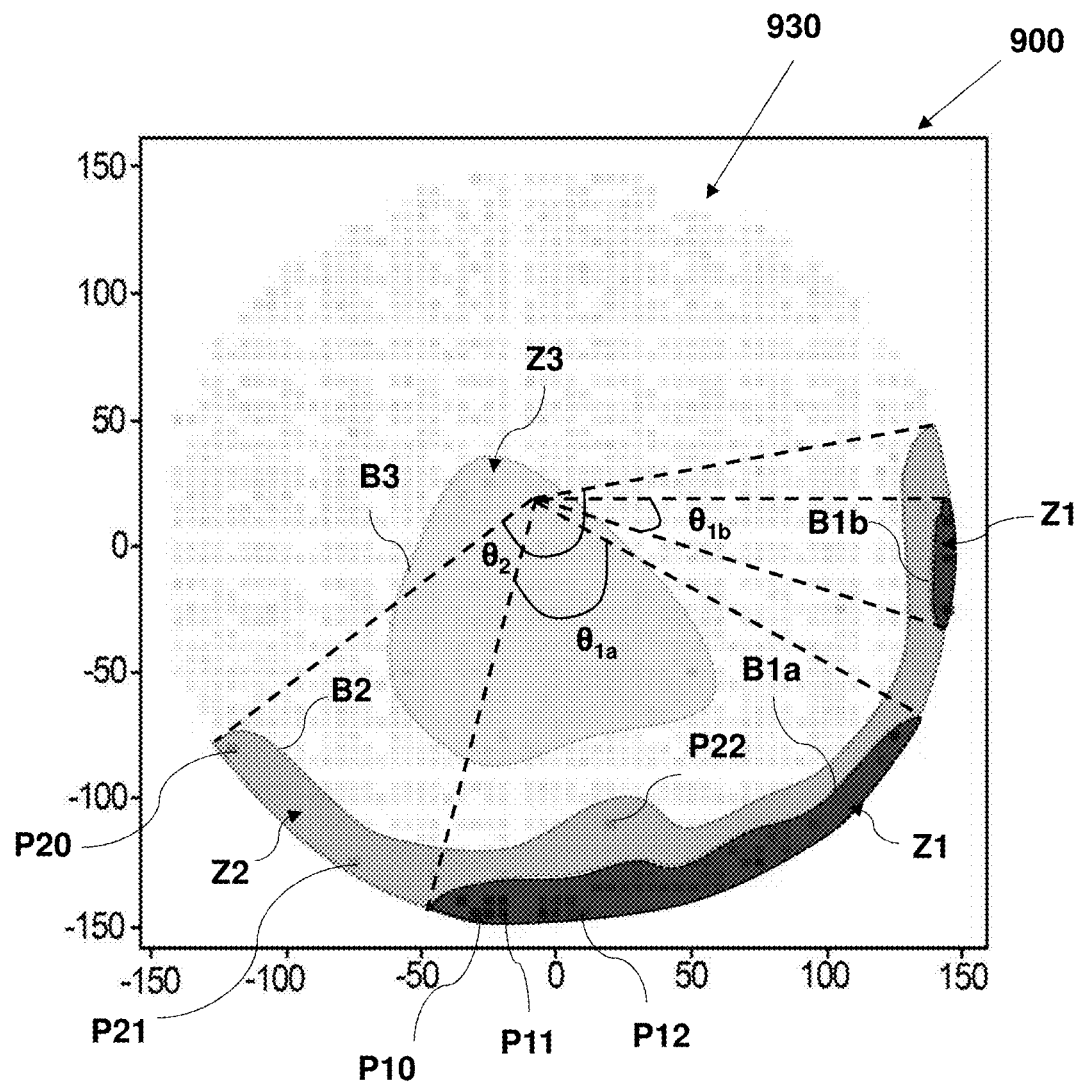
FIG. 9 illustrates example zones determined based on a distribution of the residue according to an embodiment.

The method 500, in process P54, involves determining, via a computing system (e.g., system 100 of FIG. 14), a zone 542 of the spatial map 501 based on an attribute of the distribution of the residue within the spatial map 501. In an embodiment, a zone 542 refers to a region of the spatial map 501 having a particular variation in the distribution of the residue. In an embodiment, the spatial map 501 of the residue may be divided into a plurality of zones, each zone have a variation of the residue different from the other. In an embodiment, the zone 542 may be a single region or the zone 542 may be a set of discrete regions spread at different locations on the substrate. An example of zones is illustrated in FIG. 9, where a first zone Z1 includes two regions along an edge of the substrate, as shown, and a second zone Z2 is a single region adjacent to the first zone.

In an embodiment, determining the zone 542 involves determining whether the variation of the distribution of the residue exceeds a predefined threshold. For example, the variation in the distribution of the residue may change in a radial direction as one moves from a center to the edge of the substrate. For example, the different zones can be defined by comparing the 1σ variation values for the different areas on the wafers. If the 1σ variation values differ significantly from one area of the wafer to the other, then two zones can be defined. In another example, a different statistical descriptor than variation may be used. For example, a statistical descriptor may be related to a range of the population in certain areas of the wafer: if the values for the range are significantly different, e.g., between the center and the edge of the wafer, then two discrete zones can be defined. In an embodiment, a predefined threshold may be in terms of CD values. Furthermore, the process P54 involves, responsive to the variation the exceeding of the predefined threshold, defining a different zone. For example, a region around the center portion having 1σ variation may be considered a first zone and another region around the edge portion having 3σ variation may be defined as a second zone.

In an embodiment, the determining the zone 542 is an iterative process. In the iterative process a plurality of zones are obtained based on the variation of the distribution of the residue, such that a first zone of the plurality of zones has a first variation of the distribution of the residue, and a second zone of the plurality of zones has a second variation in the distribution of the residue. In an embodiment an iteration of determining the zone involves identifying boundaries of each of a plurality of zones based on a clustering algorithm or a classification algorithm.

For example, in an embodiment, the determining of the zone 542 involves executing a classification algorithm with the spatial map 501 of the distribution of the residue as input. The classification algorithm outputs one or more groups of the residue based on the variation in the residue. Further, a boundary around each group of the one or more groups of residue is identified, where a zone 542 is a region within the boundary. In an embodiment, the classification algorithm is a machine learning model trained to identify zones based on the variation in the distribution of the residue or the variation of the characteristic of the printed substrate. In an embodiment, the classification algorithm involves a clustering analysis based on at least one of: k-nearest mean, mean-shifting, naive-Bayes and back propagation neural network, Density-Based Spatial Clustering of Applications with Noise, Gaussian mixture model, or hierarchical clustering.

In an embodiment, the iteration of determining the zone further involves modifying the zones or a boundary of the zone(s) based on metrology data corresponding to a characteristic of a pattern on a substrate. For example, the iteration involves obtaining metrology data 548 across the substrate. In an embodiment, the metrology data 548 may be limited to a few selected zones (e.g., zones with relatively higher variation in the distribution of the residue). For example, the metrology data corresponding to the characteristic of a printed substrate may be obtained within the first zone (e.g., the zone Z1 of FIG. 9) and the second zone (e.g., the zone Z2 of FIG. 9). In an embodiment, the first zone and the second zone is separated by a first boundary (e.g., B1$a$ and B1$b$ in FIG. 9) between the first zone (e.g., Z1 in FIG. 9) and the second zone, and the second zone (e.g., Z2 in FIG. 9) is identified by a second boundary (e.g., B2 in FIG. 9). Once the metrology data is obtained, residues may be determined, which can be further used for modifying the first boundary around the first zone of the residue.

In an embodiment, for determining of the zone (e.g., using classification algorithm), the process may be configured to determine the zone in terms of radial distance from a center of the substrate. For example, by defining radius and theta (an angle about a center of the substrate) as a parameter of the classification algorithm. In an embodiment, the zone is defined as an enclosed region within an irregular boundary in a radial direction and spanning a certain angular region of the substrate. For example, zones Z1 and Z2 in FIG. 9 have irregular boundary that are spread in an angular direction around the edge of the substrate. Accordingly, in an embodiment, the determining the zone involves determining a radial boundary and an angular span (e.g., θ1$a$ and θ1$b$ of Z1 and θ2 of Z2 in FIG. 9) of the radial boundary distribution of the residue based on the variation of the distribution of the residue exceeding a predefined threshold in the radial direction, an angular direction or a combination thereof.

The method 500, in process P56, involves determining, via the computing system (e.g., system 100 of FIG. 14), the probabilistic model 544 based on the zone 542 and the distribution of the residue values or the values of the characteristic of the substrate within the zone. The probabilistic model 544 is a model configured to predict a characteristic of a pattern within a particular zone of the substrate, where the zone is defined based on the distribution of the residue as discussed earlier. Accordingly, a probabilistic model is defined per zone of the substrate. Thus, in an embodiment, the probabilistic model 544 comprises a set of probabilistic models.

In an embodiment, the determining the probabilistic model 544 involves obtaining (e.g., via a metrology tool) values of the characteristic of the pattern of a substrate within the zone (e.g., zones Z1, Z2), and determining statistical parameters of the probabilistic model based on values of the characteristic of the pattern or values of the residue corresponding to the characteristic of the pattern within the zone. In an embodiment, the statistical parameters of the probabilistic model comprise a mean and standard deviation (or variance) values. In an embodiment, the probabilistic model is a Gaussian distribution having a mean and standard deviation fitted based on the values of the characteristic of the pattern within one or more zones. In an embodiment, a statistical parameter may be a measured range of values or higher moments such as skewness and kurtosis.

In an embodiment, the probabilistic model is adaptive. In other words, one or more parameters of the probabilistic model may be modified based on the changes in the zone(s) or a number of measurements within a zone. For example, over a period of time, the patterning process may drift resulting in change in spatial characteristic of the substrate. For example, more defect may start to appear at a center compared to patterning of previous substrates. Such change in spatial characteristic will be reflected in the spatial map of the residual, which will affect the zones (e.g., the boundary of the zone) that are determined based on the residuals as discussed in process P54. For example, a zone (e.g., Z1) may increase in size, more discrete regions of the substrate (e.g., a center portion) may be included in the zone (e.g., Z1), etc. As the zones change, the probabilistic model may be modified based on such changed zones.

For example, the method 500, in process P58, further involves adjusting, via the computing system (e.g., system 100 of FIG. 14), the probabilistic model 544, or generating a new model, if a new zone is created. The process P58 involves obtaining additional metrology data 548 (e.g., from subsequently processed substrates) and distribution of the residues corresponding to the additional data, adjusting the zone (e.g., 542) based on the distribution of the residues corresponding to the additional data, and adjusting the probabilistic model 544 based on an adjusted zone 542'. In an embodiment, the adjusting of the probabilistic model 544 involves adjusting a statistical parameter of the probabilistic model to improve accuracy of measurements of the metrology tool (e.g., e-beam based data or measurements). For example, adjusting a mean and variance of the probabilistic model associated with the adjusted zone 542'. The adjusting of the zones may be performed in a similar manner as discussed in process P54, for example, inputting the additional data to the clustering algorithm and depending on a variation (resulting from the additional data) of the distribution of the residue, a different set of zone may be identified or boundaries of the existing zones 542 may be adjusted.

The method 500, in process P60, may further involve ordering the zones according to the variations in residue and guiding the metrology tool to appropriate zones to collect data. The number of sampling points per zone may be different. For example, relatively high number of sample or data points (100, 150, 300, etc.) may be obtained from a zone having highest variation and only few samples (e.g., 10, 15, 20, etc.) may be obtained from a zone having relatively low variation within the spatial map.

In an embodiment, process P60 involves ordering the plurality of zones such that a zone of the plurality of zones is arranged in a descending order based on associated values of the variation of the distribution of the residue within the spatial map 501. Further, the determining of the sampling plan is based on the ordering of the plurality of zones and the probability predicted by the probabilistic model corresponding to a given zone. In an embodiment, the descending order refers to arranging zones based on decreasing values of variation of the distribution of the residue. For example, the descending order comprises a first zone associated with a highest value of the variation, a second zone associated with a second highest value of the variation, . . . , and the last zone associated with the lowest value of the variation of the distribution of the residue.

Further, the method involves guiding a metrology tool (e.g., EBI or optical tool) to measure a characteristic of a pattern at different locations on a printed substrate based on the ordered plurality of zones. In an embodiment, a pattern (e.g., having a contact hole and a line) at different locations refer to a pattern that may be printed on different locations on a substrate such as within one die or across different dies on the same substrate.

Furthermore, the measurements obtained in the process P60 may be used to determine defects. For example, the method 500 may involve determining the characteristics of the pattern on the printed substrate that are outside a specification based on the measurements from the metrology tool. For example, CD values within a first zone (e.g., Z1) may be obtained and checked whether the CD values breach a predefined threshold. If there is a breach, then a defect is detected. According to the present disclosure, the zone 542 are adjusted based on more data being collected and further based on the adjusted zones 542', the probabilistic model 544 is adjusted. Thus, adjusted probabilistic model 544' can predict the probability of finding a defect where the metrology tool is directly more accurately.

Thus, in an embodiment, the probabilistic model may be used for determining, based on a probability determined by the probabilistic model 544 (or the adjusted probabilistic model 544'), the predicted presence of at least one physical item (e.g., a printed substrate) out of specification in a measurement location or field of view of a metrology tool. Further, based on the probability, a sampling plan of measurement locations can be determined that indicates where to measure on physical item instances, if any, that are out of specification.

Figure 6A:
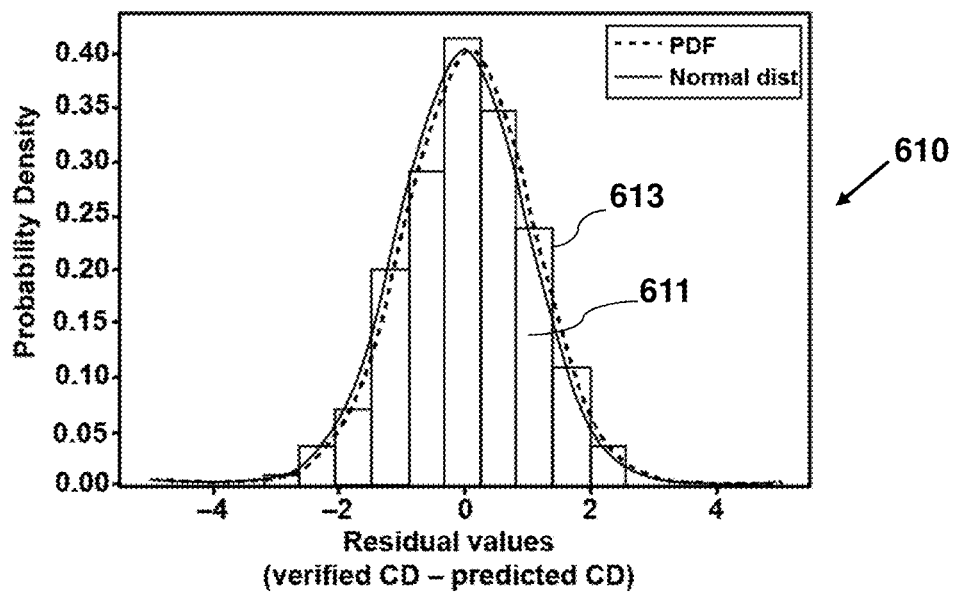
FIG. 6A is an example distribution of a residual according to an embodiment.
Figure 6B:
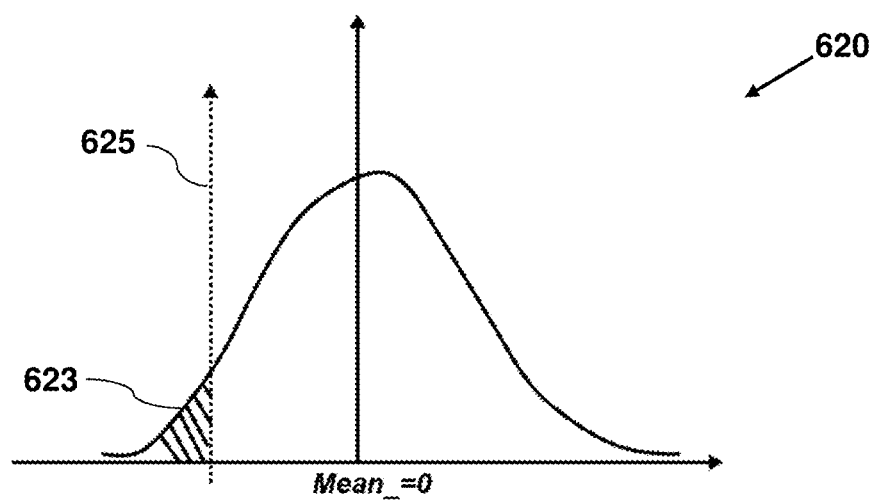
FIG. 6B is an example probability of defect based on the distribution of the residue in FIG. 6A according to an embodiment.
Figure 7:
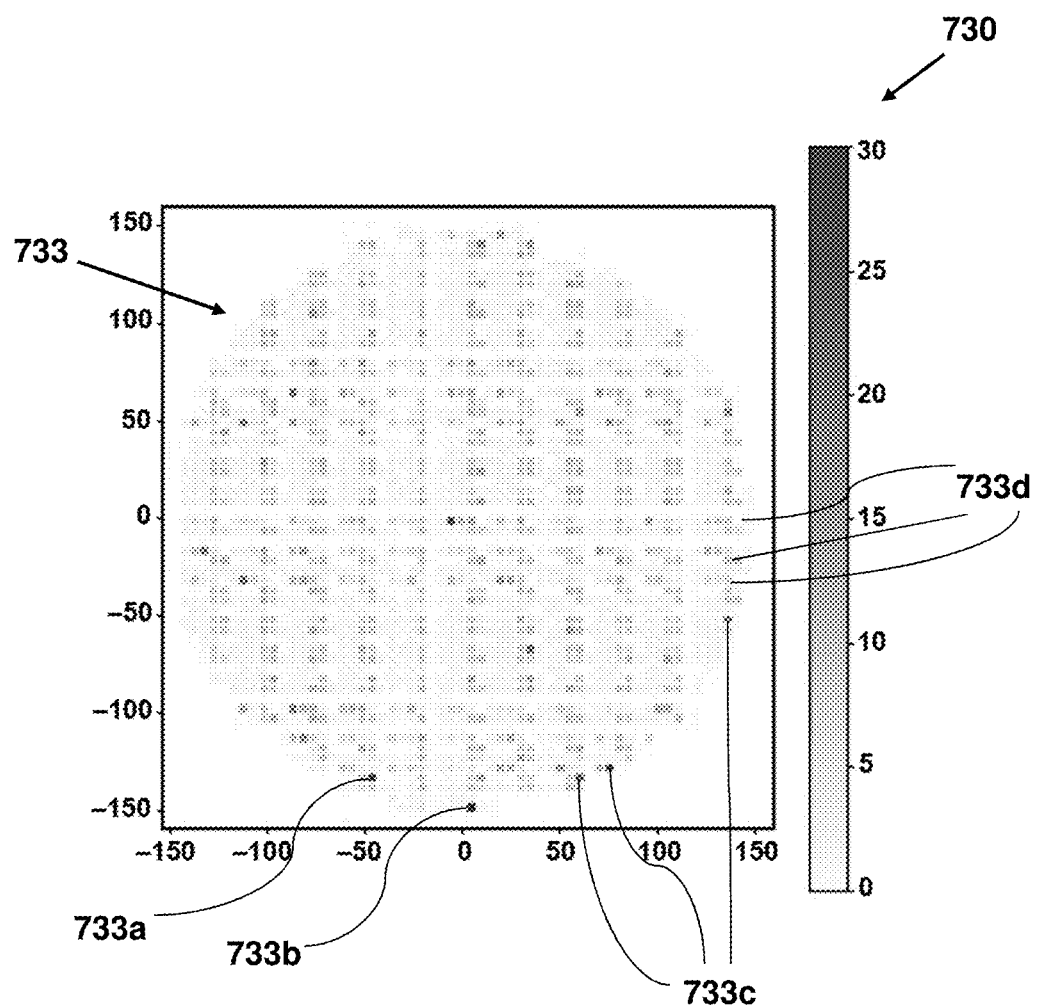
FIG. 7 illustrates an example method of obtaining a spatial map of the distribution of a residue according to an embodiment.

In an example, the probability (e.g., 623) that a pattern is a defect is the integration of a PDF of a CD (as an example of an attribute of the distribution of the characteristic) over a range from minus infinity to a threshold value (e.g., 625 in plot 620 of FIG. 6B). Practical considerations may affect the choice of the threshold value. For example, if the total number of inspections or the amount of time available for inspection is limited, the threshold value may be made smaller, thereby reducing the number of patterns considered defects. The threshold value may be normalized using data from a test substrate. For example, the threshold value may be chosen such that the total probability of defects is comparable to (e.g., within an order of magnitude from) the actual number of defects on the test substrate.

The probability that the pattern is a defect may be used to guide inspection of a substrate produced by the device manufacturing process. A pattern with a higher probability of being a defect may be prioritized in the inspection over a pattern with a lower probability of being a defect.

FIGS. 6A-6D illustrates an example method of obtaining a spatial map 630 (an example of 501) of the distribution of a residue 611. According to an embodiment, referring to FIG. 6A, the residue 611 is a histogram of a difference between a verified characteristic of a pattern and a predicted characteristic of a pattern. For example, verified values of the characteristic (e.g., CD uniformity (CDU), line width roughness (LWR), line edge roughness (LER), etc.) of pattern instances may be actual values of the characteristic obtained by measuring the pattern instances, for example, using a suitable metrology tool or simulated values of the characteristic using a rigorous model. While a predict value of the characteristic of the pattern instances are obtained using the non-probabilistic model. In an embodiment, the residue 611 may be determined as a difference between verified CD and a predicted CD values and plotted on a graph such as graph 610. The residue 611 has a distribution across the substrate as shown. Further, an attribute of the distribution of the residue 611 may be determined as discussed in process P52. For example, the attribute 613 of the distribution of the residue may be a PDF, CDF or eCDF. In an embodiment, the attribute 613 (e.g., PDF) may be interchangeably be used to refer to the residue 611 or the distribution of the residue 611.

In an embodiment, referring to residual plot 610, the attribute 613 of the distribution of the residue is determined based on simulation data and measured data corresponding to a characteristic of an ensemble of physical items (e.g., N printed substrates having different pattern types or similar pattern types). As mentioned earlier in method 500, the attribute 613 of the distribution of the residue with respect to the ensemble of physical items comprises a cumulative distribution function for the ensemble of physical item instances. In an embodiment, the attribute 613 of the distribution of the residue with respect to the ensemble involves the attribute of the distribution of the residue with respect to at least one physical item instance corresponding to at least one physical item type of the ensemble to the power of a number of physical item instances in the ensemble. In an embodiment, the attribute 613 of the distribution of the residue with respect to the ensemble is a function defined at least by $[1-(1-\text{eCDF})N]$ or $[1-(1-\text{CDF})N]$, wherein N is the number of physical item instances in the ensemble, CDF is a cumulative distribution function of the distribution of the residue with respect to at least one physical item instance corresponding to at least one physical item type of the ensemble, and eCDF is an empirical cumulative distribution function of the distribution of the residue with respect to at least one physical item instance corresponding to at least one physical item type of the ensemble. In an embodiment, the physical item instance corresponds to a pattern on a substrate produced by a device manufacturing process.

In an embodiment, based on the attribute 613 a defect probability may be determined. For example, an area under the curve of the PDF 613 beyond a threshold value 625 of the characteristic is a probability that a defect may occur. In an embodiment, the threshold value may be a CD value, a difference in measured CD and a predicted CD, or any characteristic of the pattern other than CD.

Figure 6C:
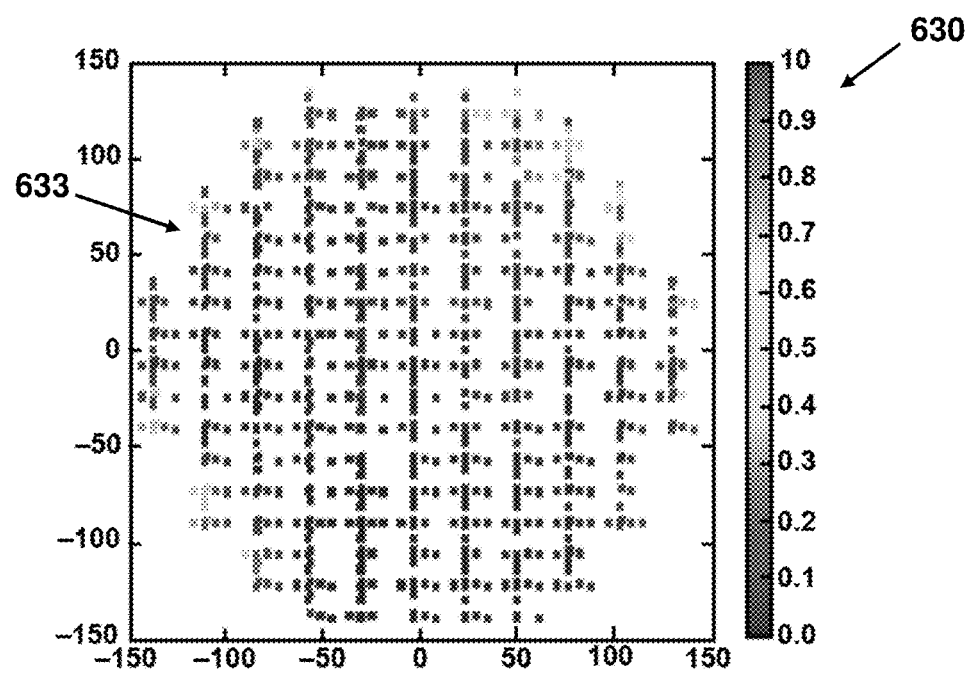
FIG. 6C is an example spatial map according to an embodiment.
Figure 6D:
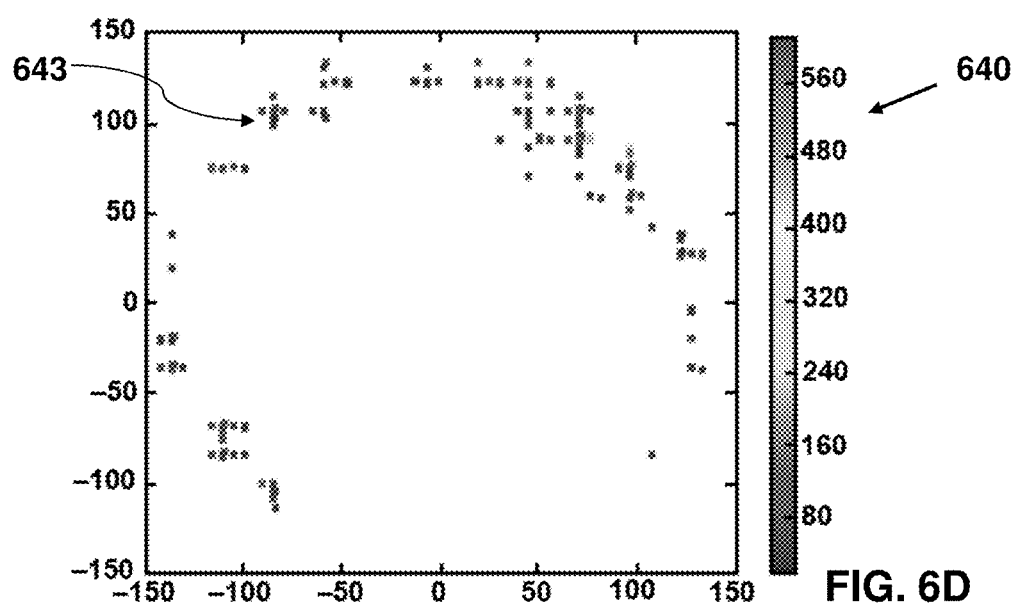
FIG. 6D is an example sampling based on the spatial map of FIG. 6C according to an embodiment.

Such attribute (e.g., 613 is a PDF based on CD values) of the residue (e.g., 611) may be determined at a plurality of locations on a substrate. For example, a CD-based PDF having a mean and variance is available at each of the plurality of locations on the substrate. Referring to FIG. 6C, a spatial distribution of each such CD-based PDF may form a spatial map 630 of the distribution 633 of the residue. In an embodiment, the CD-based PDF may be further used to determine a defect probability, as mentioned earlier, at each such location of the substrate. So, in an embodiment, the spatial map 630 of such defect probability also referred as a defect map 630 may be obtained. In the spatial map 630, different locations associated with 633 on the substrate have different variance. For example, a variance in residue may be relatively higher at an edge compared to at the center.

In an embodiment, based on the defect map 630, a sampling scheme 640 (see FIG. 6D) may be defined. For example, defects having relatively higher probability 643 (e.g., highest probability) across the substrate may be sampled, thus more data corresponding to defects occurrence (also referred as hotspots locations) on the substrate is captured thereby improving a capture rate of the metrology tool. Such measurements may be important in controlling various parameters of the patterning process, optimizing the patterning process, making adjustments to the patterning process over a period of time, etc. so that the yield of the patterning process is improved. However, if the measured data do not capture the defects, metrology time and resources may be wasted and the adjustments to the patterning process may be ineffective. Thus, an accurate sampling scheme used to guide the metrology tool is important.

According to the present disclosure, the sampling scheme such as 643 may be determined based on the adaptive probabilistic model (e.g., 544 discussed in FIG. 5) configured to predict a defect probability. Thus, the more accurate an adaptive probabilistic model 544' is the more accurate the sampling scheme 643 will be, thereby improving the yield. As mentioned earlier, a fixed probabilistic model determined based on data measured on an entire substrate may not be as accurate as the adaptive probabilistic model (e.g., 544). According to an embodiment, based on the zones, different probabilistic models may be available.

Figure 8A:
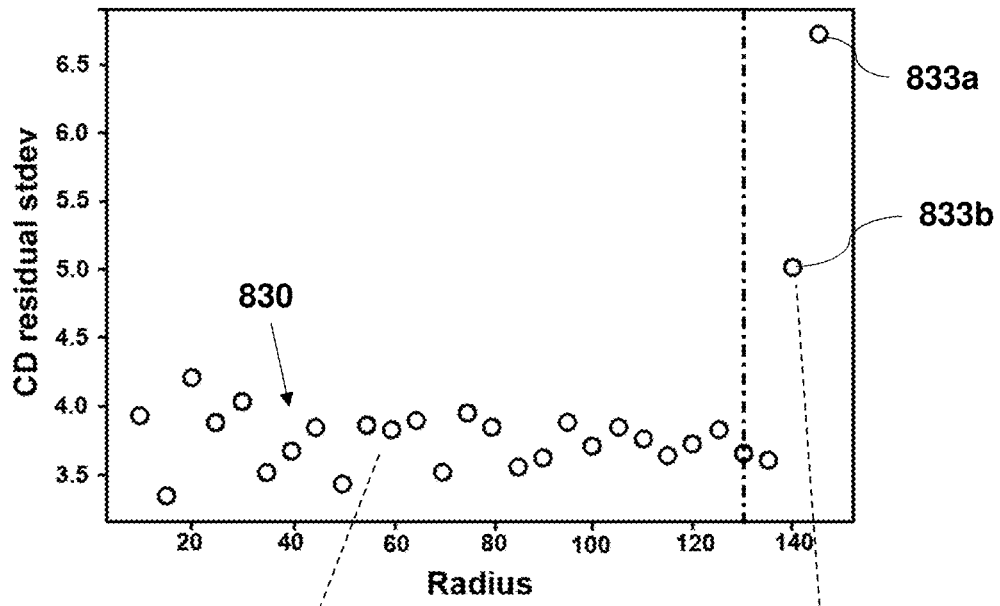
FIG. 8A illustrates example values standard deviation of a distribution of a residue on a substrate in a radial direction according to an embodiment.
Figure 8B:
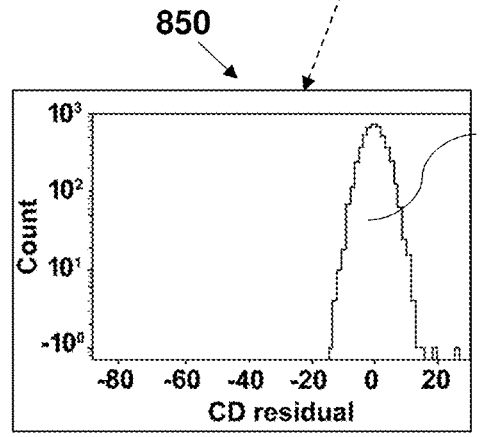
FIG. 8B is an example histogram of the distribution of the residue within a region spanning a particular radial distance according to an embodiment.
Figure 8C:
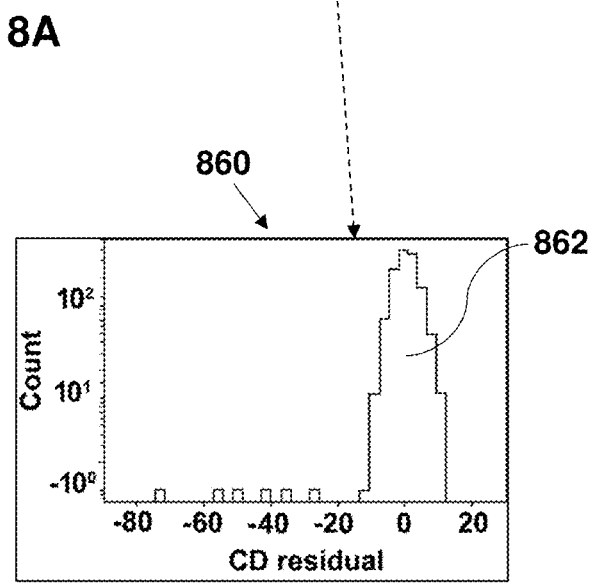
FIG. 8C is an example histogram of a distribution of residue at the edge region of the substrate according to an embodiment.

FIGS. 8A-8C illustrate an example of standard deviations of the distribution of the residue 830 (another example of residue 613 or 733) across the substrate in a radial direction and how the distribution of the residue 830 and thereby the corresponding attribute of the distribution changes due to spatial variations across the substrate. The plot, in FIG. 8A, shows a standard deviation values of the residue 830 along a radial direction from a center of a substrate. In an example, the residue 830 is a difference between the computed CD and measured CD values corresponding to a pattern on the substrate. As shown, the standard deviation of the residue 830 is approximately around 4 at the center and remains around 4 away from the center along the radial direction. The standard deviation of the residue 830 does not vary substantially from 0 (center) to approximately 130 cm radius across the substrate. A distribution of residue 852 within such region is shown in plot 850 of FIG. 8B. The plot 850 shows that the spread of the residue 852 is primarily concentrated around a zero value and does not has a significant tail portion. Thus, indicating a probability of defects within 0-130 cm is relatively low.

However, at an edge portion (e.g., between beyond 130 cm), the standard deviation is relatively higher, for example, approximately 5 around 140 cm and 6.5 beyond 140 cm. Also, a distribution of residue 862 at the edge region is shown in plot 860 of FIG. 8C. The plot 860 shows that the distribution of the residue 862 has a relatively wider spread and have a significant tail portion. Thus, indicating a probability of defects beyond 130 cm is relatively high. FIGS. 8B and 8C clearly show there can be a significant variation in distribution of the residue at different locations on the substrate. Thus, according to the present disclosure, the probabilistic model predicting defects is also adapted according to the change in variation of the residue and corresponding zones. If a single probabilistic model based on a single distribution of residue is used for an entire substrate to predict defect, then the probabilistic model may not accurately predict defects. On the other hand, a first probabilistic model based on a first zone (e.g., having the distribution 852) and a second probabilistic model based on a second zone (e.g., having the distribution 862) are used then defect predictions will be more accurate. Furthermore, the patterning process may cause a change in spatial characteristic over a period of time, thus changing the distribution of the residue and the corresponding zones. The present disclosure also accounts for such changing zone and accordingly the adjusting of the probabilistic model per zone, as discussed in method 500.

Example zones determined based on the distribution of the residue (e.g., as discussed in process P54 of method 500) are illustrated in FIG. 9. A spatial map 900 of a distribution of the residue 930 on a substrate is shown. The distribution of the residue 930 has different variations at different locations. For example, some points (e.g., P10, P11, P12 . . . along an edge) may have a highest variation across the substrate, some points (e.g., P20, P21, P22 . . . along the edge or away from the edge) have a second variation, which is lower than the highest variation, while some points around the center of the substrate have least variation. Based on such variation of the distribution of the residue 930, different zones may be determined using different clustering techniques, machine learning models for classification of data, or other appropriate methods. For example, the first zone Z1 in a radial direction around the edge spanning at two discrete places on the substrate. The first zone Z1 is defined by the boundary B1$a$ spanning an angle θ1$a$ and B1$b$ spanning an angle θ1$b$. The second zone Z2 is also defined around the edge having a boundary B2 and a relatively wider span of an angle 82. A third zone Z3 is defined around a center of the substrate, where the variation of the distribution of the residue is relatively lower (e.g., lowest) than for Z1 and Z2. The zone Z3 is defined by a boundary B3 and spans 360°. Note that the boundaries of the zones Z1, Z2, Z3 are flexible (in terms of radius and angle) having irregular shape (e.g., radial spread). Further, as mentioned earlier, when more data is obtained, the boundaries of the zones Z1, Z2, Z3 may change, more zones may be included, or a zone may be removed. Accordingly, the probabilistic model per zone is adapted, as discussed in the process P58.

Furthermore, based on the predictions of the probabilistic model per zone, a different sampling plan may be defined per zone. For example, a relatively greater number of measurements (e.g., more than 100 sample points) may be obtained in zone Z1, a relatively lower number of measurements may be obtained in zone Z2 (e.g., 30-100 sample points), relatively few measurements (e.g., less than 30 points) may be obtained in zone Z3. Thus, predictions based on the sampling data is improved, leading to more efficient use of the e-beam tool for verification of defects. In an embodiment, an improved sampling may also improve the metrology tool's capture rate, for example, the metrology time and resources are used more efficiently.

Figure 10:
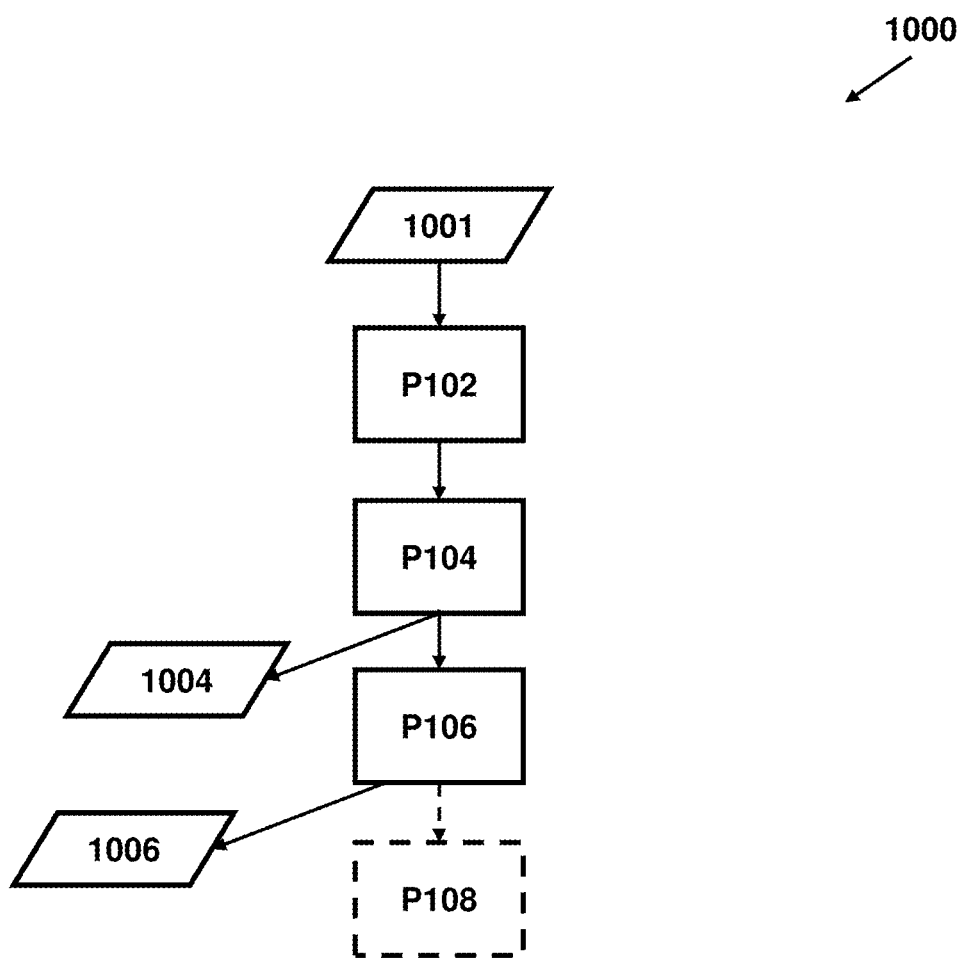
FIG. 10 is a flow chart of a method for determining a sampling plan for a metrology tool of a patterning process according to an embodiment.

FIG. 10 is a flow chart of a method 1000 for determining for a metrology tool, a sampling plan, of a patterning process, according to an embodiment. In the method 1000, the sampling plan is determined based on the probability of a defect predicted by a probabilistic model (e.g., 544 or 544') per zone of the substrate. The sampling plan includes locations at which measurements must be taken to identify a defective pattern on the substrate. Thus, in an embodiment, the sampling plan may determine locations based on probabilities of defects starting from highest probability to lowest probability.

The method 1000, in process P102, involves obtaining a probabilistic model 1001 corresponding to a zone of a substrate. For example, the probabilistic model 1001 (an example of 544 or 544') can be obtained according to the process P56, as discussed in method 500. The probabilistic model 1001 may be a first version of the model obtained based on data from N number of substrate (e.g., 10 substrates), or an adjusted model obtained based on additional data from subsequently proceed substrate (e.g., 11th, 12th, 15th, 20th, etc.). Further, process P104 involves predicting, via a computing system (e.g., processor 104 of the system 100), a probability 1004 using the probabilistic model 1001. In an embodiment, the probability 1004 is a probability of defect occurrence at a particular location on the substrate. In an embodiment, the defect may be defined in terms of a characteristic (e.g., CD, LWR) of the pattern. Accordingly, the probability 1004 may a value of a characteristic (e.g., CD, LWR) of the pattern to be measured.

Once the probability of a defect at one or more locations of the substrate is known, process P106 involves determining, based on the probability 1004, a sampling plan 1006 comprising measurement locations on a substrate for measurements of a characteristic to determine whether the substrate is out of specification. The probability 1004 can be used for the various uses such as for statistic process chart creation, for sampling plan creation, etc.

For example, the probability 1004 can be used to create the sampling plan 1006 for measurement by a metrology tool (e.g., shown in FIGS. 12 and 13) of a substrate. The sampling plan 1006 can be used to identify defects across the substrate; the identified defects can be used for device manufacturing process modification, control, design, etc. The probability that a certain measurement location (e.g., field of view (FOV) or image) has an extremum characteristic (e.g., CD) that exceeds a control limit (i.e. contains a defect) provides a methodology to prioritize the locations to be inspected with a metrology tool. For example, starting from the measurement location with highest probability, a sampling plan can be defined where locations are added until a desired criteria of capture of defects is achieved (e.g., a level of capture rate or nuisance rate is achieved or, for example, when the sum of probabilities for the sampling locations reaches 80% or higher, reaches 85% or higher, reaches 90% or higher, reaches 95% or higher). In this way, an improved (shorter) inspection time may be achieved.

As a more concrete example, in an embodiment, the probability values of the measurement locations can be sorted, for example, in order of increasing values and then be used to calculate a cumulative probability.

In an embodiment, the sampling plan 1006 may change over time as the patterning process may cause drifts or deviations from normal operating parameters such as substrate level, optical parameters of a projection system, etc. Thus, in an embodiment, the process P106 (similar to process P58 of method 500) involves obtaining, via the metrology tool (e.g., shown in FIGS. 12 and 13), additional metrology data corresponding to subsequently processed substrates and distribution of the residues corresponding to the additional data. Then, adjusting a given zone of the plurality of zones based on the distribution of the residues corresponding to the additional data. Once the zones are adjusted, the process further involves adjusting the probabilistic model based on the adjusted zone. In an embodiment, the adjusting of the probabilistic model 1001 involves adjusting a statistical parameter of the probabilistic model to improve accuracy of measurements. Further, the process involves, adjusting the sampling plan based on the probability determined by the adjusted probabilistic model.

In an embodiment, the process P106 for determining the sampling plan 1006 may involve obtaining a spatial map (e.g., 501, 730) of a distribution of a residue corresponding to a characteristic of a pattern on the substrate, obtaining a plurality of zones (e.g., Z1, Z2, Z3, etc.) of the substrate based on the distribution of the residue and based on a probabilistic model per zone of the plurality of zones. Further, the process P106 involves ordering the plurality of zones such that a zone of the plurality of zones is arranged in a descending order based on associated values of the variation of the distribution of the residue within the spatial map 501. In an embodiment, the descending order refers to arranging zones based on decreasing values of variation of the distribution of the residue. For example, the descending order comprises a first zone associated with a highest value of the variation, a second zone associated with a second highest value of the variation, . . . , and the last zone associated with the lowest value of the variation of the distribution of the residue. Further, the process P106 involves determining the sampling plan 1006 based on the ordering of the plurality of zones and the probability predicted by the probabilistic model corresponding to a given zone.

Figure 12:
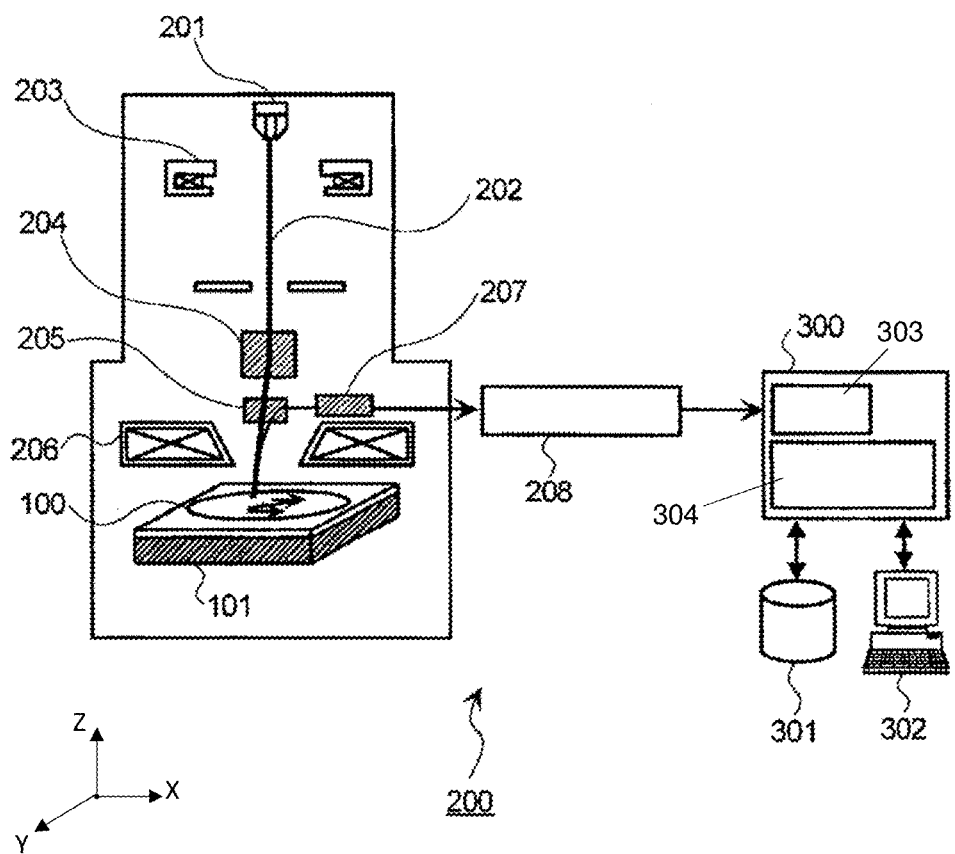
FIG. 12 schematically depicts an embodiment of a scanning electron microscope (SEM) according to an embodiment.
Figure 13:
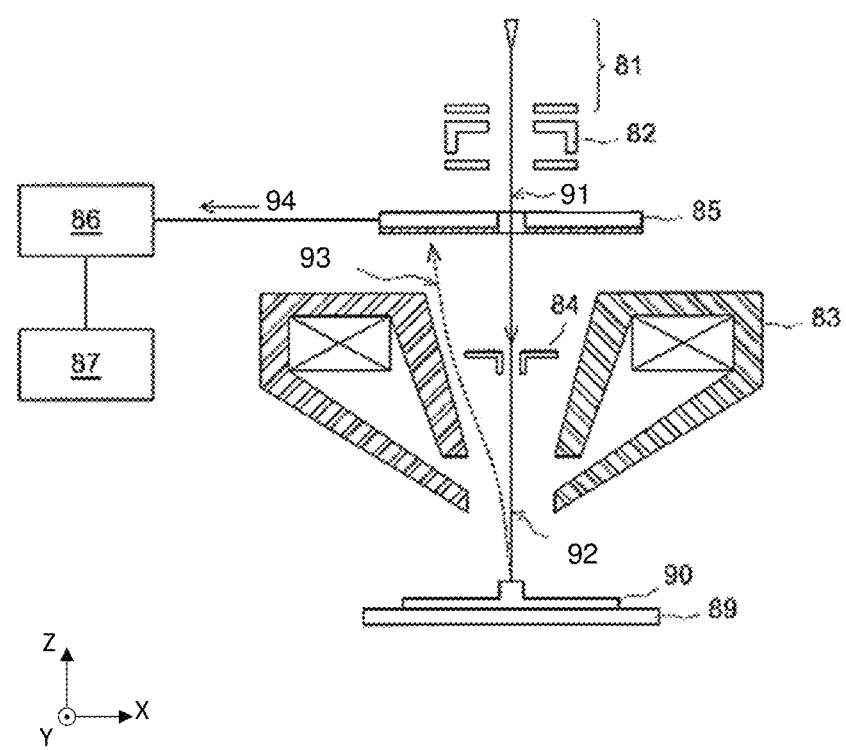
FIG. 13 schematically depicts an embodiment of an electron beam inspection apparatus according to an embodiment.

Once, the sampling plan 1006 is obtained, as discussed above, the metrology tool may be instructed or guided to desired locations, for example, via the computing system 100 sending signal to the metrology tool (e.g., shown in FIGS. 12 and 13). For example, process P108 involves guiding, based on the sampling plan 1006, the metrology tool to measure a characteristic of a pattern at different locations on a printed substrate produced by the patterning process. In an embodiment, a pattern (e.g., having a contact hole and a line) at different locations refer to a pattern that may be printed on different locations on a substrate such as within one die or across different dies on the same substrate.

Figure 11:
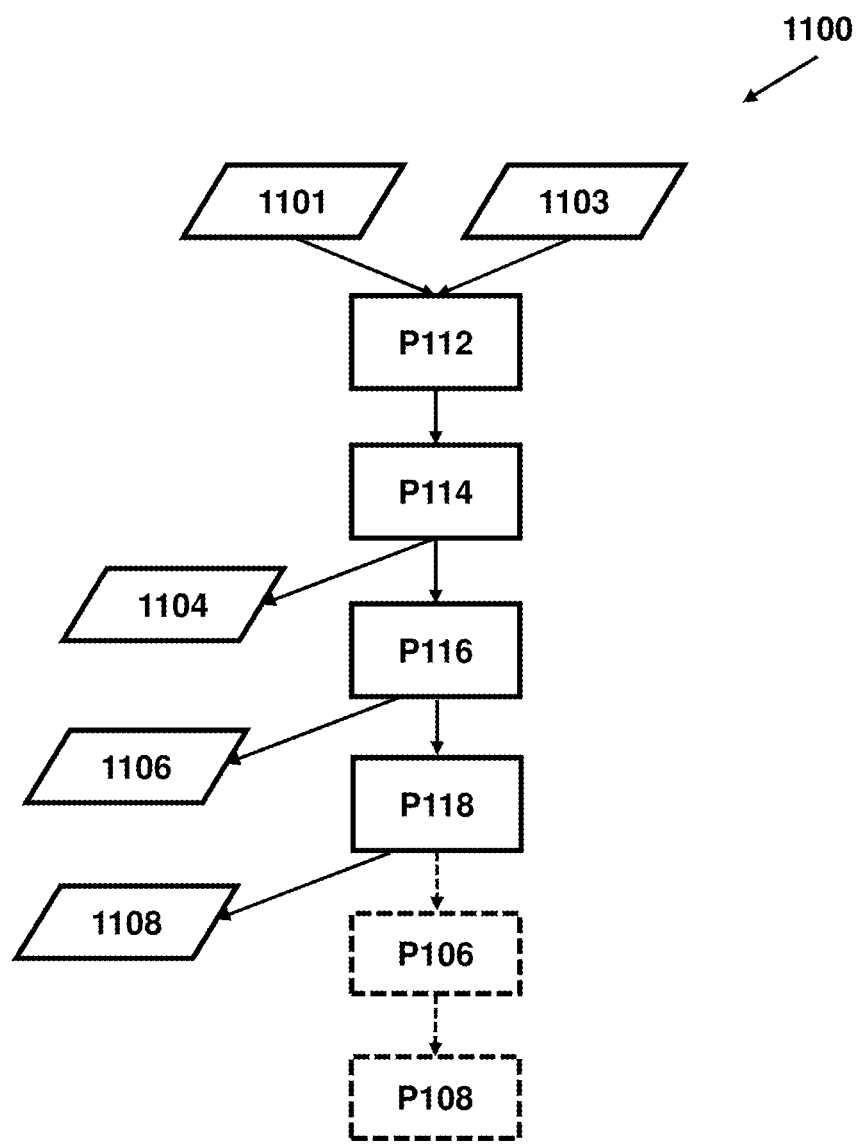
FIG. 11 is a flow chart of a method for determining zones of a substrate based on a process variability of a patterning process according to an embodiment.

FIG. 11 is a flow chart of a method 1100 for determining zones of a substrate based on a process variability of a patterning process. In an embodiment, a 'fingerprint' of process variability (e.g. local CDU) is associated with specific process step (or tool) based on the process or tool characteristics. A processing 'fingerprint' is a spatial distribution of errors typically caused by one or more certain process steps. For example, a substrate table may have a warp in a support surface which will consistently introduce certain errors at certain locations on the substrate patterned using that substrate table. So, the sampling locations can provide a user with information that helps identify and/or solve a root cause of defects on the substrate. An association between the fingerprint and a defect (or the residue) can be used to quantify process or tool contributions to observed defects. Then, signals (e.g., measurement data) from the processing tool(s) can be used to adapt a sampling plan in-line (i.e., during manufacturing), based on, for example, machine-learning algorithms linking such signals to changes in the variability of the hotspots characteristics on printed substrates.

The method 1100, in process P112, involves obtaining (i) a spatial map 1101 of a distribution of a residue corresponding to a characteristic of a pattern on a substrate, and (ii) a process variation 1103 of a parameter of the patterning process. In an embodiment, the parameter of the patterning process refers to a process variable of the patterning process. For example, the parameter is at least one of dose, focus, an optical parameter, and moving standard deviation of movement (MSDz) of the substrate in the normal direction of the substrate, or moving standard deviation (MSDx,y) of movement of the substrate in a direction parallel to the substrate.

The spatial map 1101 and the process variation 1103 may be related to each other, where the process variation 1103 may affect the spatial map 1101. Thus, the method 1100, in process P114, involves detecting a relationship 1104 between the spatial map 1101 of the distribution of the residue and the process variation 1103 of the parameter of the patterning process.

The method 1100, in process P116, involves determining a zone 1106 (or a plurality of zones 1106) based on the relationship 1104. For example, in an embodiment, the determining the zone involves determining, based on the relationship, whether the process variation of the parameter of the patterning process causes a change in the distribution of the residue to exceed a predefined threshold, and responsive to the exceeding of the predefined threshold, defining a different zone.

The method 1100, in process P118, involves determining, via the computing system, the probabilistic model 1108 based on the zone and the distribution of the residue values or the values of the characteristic of the pattern on the substrate within the zone.

Furthermore, the method 110 may involve process P106 to determine a sampling plan based on the zones 1106 and further using the sampling plan to guide the metrology tool (e.g., shown in FIGS. 12 and 13), as discussed in the process P108.

As mentioned earlier, inspection of, e.g., semiconductor wafers is often done with optics-based sub-resolution tools (bright-field inspection). But, in some cases, certain features to be measured are too small to be effectively measured using bright-field inspection. For example, bright-field inspection of defects in features of a semiconductor device can be challenging. Moreover, as time progresses, features that are being made using patterning processes (e.g., semiconductor features made using lithography) are becoming smaller and in many cases, the density of features is also increasing. Accordingly, a higher resolution inspection technique is used and desired. An example inspection technique is electron beam inspection. Electron beam inspection involves focusing a beam of electrons on a small spot on the substrate to be inspected. An image is formed by providing relative movement between the beam and the substrate (hereinafter referred to as scanning the electron beam) over the area of the substrate inspected and collecting secondary and/or backscattered electrons with an electron detector. The image data is then processed to, for example, identify defects.

So, in an embodiment, the inspection apparatus may be an electron beam inspection apparatus (e.g., the same as or similar to a scanning electron microscope (SEM)) that yields an image of a structure (e.g., some or all the structure of a device, such as an integrated circuit) exposed or transferred on the substrate.

The probability that one or more pattern instances are a defect may be used for various purposes. For example, the probabilities can be used to derive a statistical defect count per substrate that should be close to the actual number of defects actually present on any given substrate. In an embodiment, a statistical process chart can be created based on this statistical defect count. This also allows a decision to be made about further processing of the substrate(s) analyzed using this probabilistic computational method with, e.g., a rapid turn-around time.

The probabilities and/or statistical defect count can be used to prioritize locations to be inspected with a metrology tool (such as an electron beam inspection tool shown in FIGS. 12 and 13). Based on the probabilities and/or statistical defect count, a sampling scheme can be defined where locations are added to the sampling scheme until, e.g., a desired level of capture rate is achieved (e.g., when the sum of probabilities for the sampling sites reaches 90%) or a desired level of nuisance rate is achieved. A capture rate can be defined as the number of true positive defects divided by the total of the true positive defects and the false negative defects. The nuisance rate can be defined as the number of false positive defects divided by the total of the true positive defects and the false positive defects. As a result, an improved (shorter) inspection time may be achieved. As a related benefit, the full set of sampling locations identified in such a way should provide a spatial signature on the substrate analyzed with the probabilistic computational method of the predicted defects, which can correlate with or improve a correlation with, a processing 'fingerprint' of one or more certain process steps as part of the device manufacturing method.

The probability that the pattern is a defect may be used to guide inspection of a substrate produced by the device manufacturing process. A pattern instance with a higher probability of being a defect may be prioritized in the inspection over a pattern instance with a lower probability of being a defect.

In an embodiment, the number of pattern instances to be inspected (or the measurement locations where those pattern instances are located) per pattern type or set of a particular plurality of pattern types can be determined based on the statistical expectation of number of defects for each such pattern type or set of a particular plurality of pattern types. In an embodiment, for each pattern type or set of a particular plurality of pattern types, the inspection location can be determine based on, for example, (i) probability of a defect, and (ii) a spatial distribution of the associated pattern instance on the substrate so to, e.g., maximize the benefit of a measurement spot, FOV, or image obtained by a metrology tool (e.g., shown in FIGS. 12 and 13). In an embodiment, a fixed fraction of inspection time can be assigned to uniform sampling and measuring certain anchor features.

In an example, an ordered list of patterns may be generated based on a plurality of zones, as discussed earlier in methods 500 and 1000. The ordered list includes those pattern instances with the highest probabilities of being defects (e.g., determined using the probabilistic model 544 or the adjusted probabilistic model 548); in other words, the ordered list comprises a subset of pattern instances among the set of pattern instances, where the pattern instances in the subset have higher probabilities of being defects than the pattern instances in the set but not in the subset. The number of pattern instances in the ordered list may be determined by the inspection throughput or may be empirically determined. The number of pattern instances in the ordered list may be limited by the amount of time before the next substrate for inspection arrives. The number of pattern instances in the ordered list may be limited by the amount of radiation the substrate is allowed to receive during the inspection. In an example, the order of the pattern instances in the ordered list may be a descending order of the probabilities. In other words, the order may be that a pattern instance with higher probability of being a defect is inspected before a pattern instance with a lower probability of being a defect ("the order of descending probabilities"). In an example, the order of the pattern instances in the ordered list may be an order that causes a cost function to be at an extremum. In an embodiment, the cost function is a function of the order of the pattern instances and may represent the probabilities, the amounts of time needed for inspecting the pattern instances, the distance from one pattern instance to the next pattern instance, and/or other indicators of the performance of the inspection.

FIG. 12 schematically depicts an embodiment of an electron beam inspection apparatus 200. A primary electron beam 202 emitted from an electron source 201 is converged by condenser lens 203 and then passes through a beam deflector 204, an E×B deflector 205, and an objective lens 206 to irradiate a substrate 100 on a substrate table 101 at a focus.

When the substrate 100 is irradiated with electron beam 202, secondary electrons are generated from the substrate 100. The secondary electrons are deflected by the E×B deflector 205 and detected by a secondary electron detector 207. A two-dimensional electron beam image can be obtained by detecting the electrons generated from the sample in synchronization with, e.g., two dimensional scanning of the electron beam by beam deflector 204 or with repetitive scanning of electron beam 202 by beam deflector 204 in an X or Y direction, together with continuous movement of the substrate 100 by the substrate table 101 in the other of the X or Y direction. Thus, in an embodiment, the electron beam inspection apparatus has a field of view for the electron beam defined by the angular range into which the electron beam can be provided by the electron beam inspection apparatus (e.g., the angular range through which the deflector 204 can provide the electron beam 202). Thus, the spatial extent of the field of the view is the spatial extent to which the angular range of the electron beam can impinge on a surface (wherein the surface can be stationary or can move with respect to the field).

A signal detected by secondary electron detector 207 is converted to a digital signal by an analog/digital (ND) converter 208, and the digital signal is sent to an image processing system 300. In an embodiment, the image processing system 300 may have memory 303 to store all or part of digital images for processing by a processing unit 304. The processing unit 304 (e.g., specially designed hardware or a combination of hardware and software or a computer readable medium comprising software) is configured to convert or process the digital images into datasets representative of the digital images. In an embodiment, the processing unit 304 is configured or programmed to cause execution of a method described herein. Further, image processing system 300 may have a storage medium 301 configured to store the digital images and corresponding datasets in a reference database. A display device 302 may be connected with the image processing system 300, so that an operator can conduct necessary operation of the equipment with the help of a graphical user interface.

FIG. 13 schematically illustrates a further embodiment of an inspection apparatus. The system is used to inspect a sample 90 (such as a substrate) on a sample stage 89 and comprises a charged particle beam generator 81, a condenser lens module 82, a probe forming objective lens module 83, a charged particle beam deflection module 84, a secondary charged particle detector module 85, and an image forming module 86.

The charged particle beam generator 81 generates a primary charged particle beam 91. The condenser lens module 82 condenses the generated primary charged particle beam 91. The probe forming objective lens module 83 focuses the condensed primary charged particle beam into a charged particle beam probe 92. The charged particle beam deflection module 84 scans the formed charged particle beam probe 92 across the surface of an area of interest on the sample 90 secured on the sample stage 89. In an embodiment, the charged particle beam generator 81, the condenser lens module 82 and the probe forming objective lens module 83, or their equivalent designs, alternatives or any combination thereof, together form a charged particle beam probe generator which generates the scanning charged particle beam probe 92.

The secondary charged particle detector module 85 detects secondary charged particles 93 emitted from the sample surface (maybe also along with other reflected or scattered charged particles from the sample surface) upon being bombarded by the charged particle beam probe 92 to generate a secondary charged particle detection signal 94. The image forming module 86 (e.g., a computing device) is coupled with the secondary charged particle detector module 85 to receive the secondary charged particle detection signal 94 from the secondary charged particle detector module 85 and accordingly forming at least one scanned image. In an embodiment, the secondary charged particle detector module 85 and image forming module 86, or their equivalent designs, alternatives or any combination thereof, together form an image forming apparatus which forms a scanned image from detected secondary charged particles emitted from sample 90 being bombarded by the charged particle beam probe 92.

In an embodiment, a monitoring module 87 is coupled to the image forming module 86 of the image forming apparatus to monitor, control, etc. the patterning process and/or derive a parameter for patterning process design, control, monitoring, etc. using the scanned image of the sample 90 received from image forming module 86. So, in an embodiment, the monitoring module 87 is configured or programmed to cause execution of a method described herein. In an embodiment, the monitoring module 87 comprises a computing device. In an embodiment, the monitoring module 87 comprises a computer program to provide functionality herein and encoded on a computer readable medium forming, or disposed within, the monitoring module 87.

In an embodiment, like the electron beam inspection tool of FIG. 12 that uses a probe to inspect a substrate, the electron current in the system of FIG. 13 is significantly larger compared to, e.g., a CD SEM such as depicted in FIG. 12, such that the probe spot is large enough so that the inspection speed can be fast. However, the resolution may not be as high as compared to a CD SEM because of the large probe spot. In an embodiment, the above discussed inspection apparatus (in FIG. 13 or 14) may be single beam or a multi-beam apparatus without limiting the scope of the present disclosure.

The SEM images, from, e.g., the system of FIG. 12 and/or FIG. 13, may be processed to extract contours that describe the edges of objects, representing device structures, in the image. These contours are then typically quantified via metrics, such as CD, at user-defined cut-lines. Thus, typically, the images of device structures are compared and quantified via metrics, such as an edge-to-edge distance (CD) measured on extracted contours or simple pixel differences between images.

Figure 14:
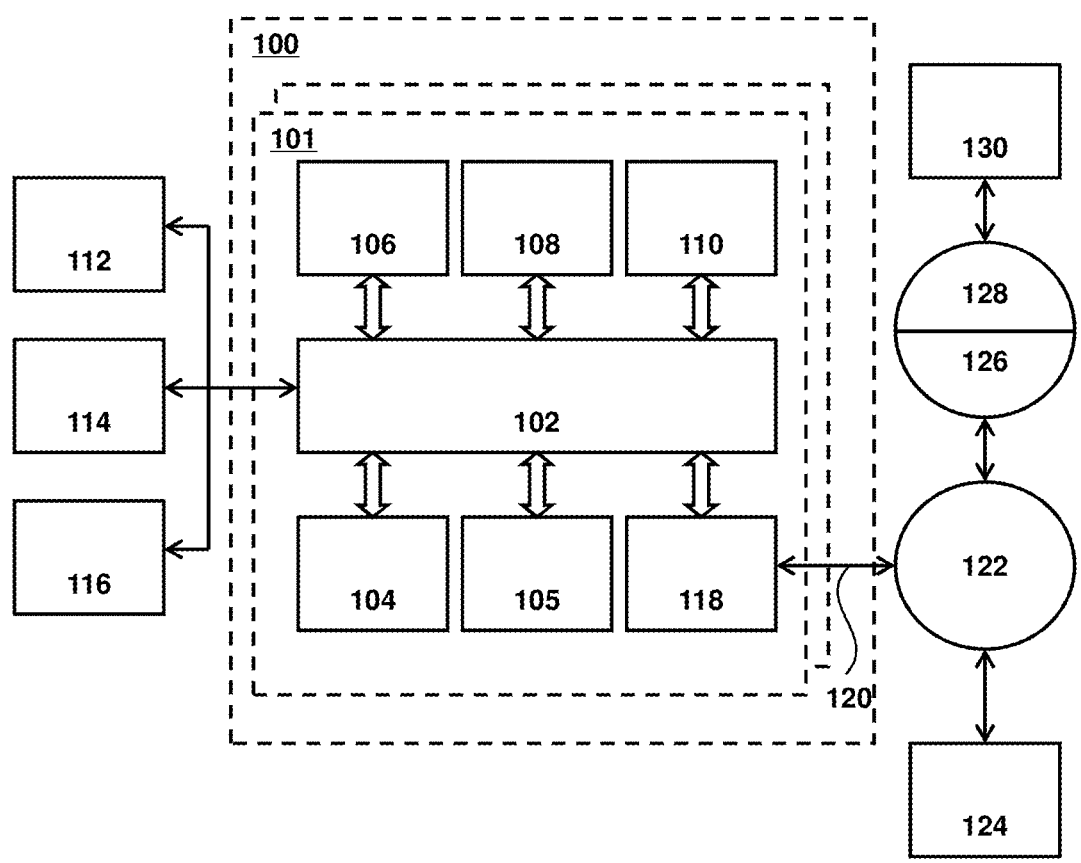
FIG. 14 is a block diagram of an example computer system according to an embodiment.

FIG. 14 is a block diagram that illustrates a computing system 100 which can assist in implementing the optimization methods and flows disclosed herein. Computing system 100 may comprise one or more individual computer systems, such as computer system 101. Further, computing system 100 may comprise, for example, a metrology tool or a portion of a metrology tool. Computer system 101 includes a bus 102 or other communication mechanism for communicating information, and a processor 104 (or multiple processors 104 and 105) coupled with bus 102 for processing information. Computer system 101 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 101 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 101 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of a process described herein may be performed by computer system 101 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 101 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 101 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 101, are exemplary forms of carrier waves transporting the information. Communication between the one or more computer system 101s that comprise computing system 100 may occur via any of various mediums. For example, communication between the one or more computer system 101s can occur via local network 122, internet 128, a wi-fi network, a cellular network, or any other usable communications medium.

Computer system 101 can send messages and receive data, including program code, through the network(s), network link 120, and communication interface 118. In the Internet example, a server 130 might transmit a requested code for an application program through Internet 128, ISP 126, local network 122 and communication interface 118. In accordance with one or more embodiments, one such downloaded application provides for the illumination optimization of the embodiment, for example. The received code may be executed by processor 104 as it is received, or stored in storage device 110, or other non-volatile storage for later execution. In this manner, computer system 101 may obtain application code in the form of a carrier wave.

Figure 15:
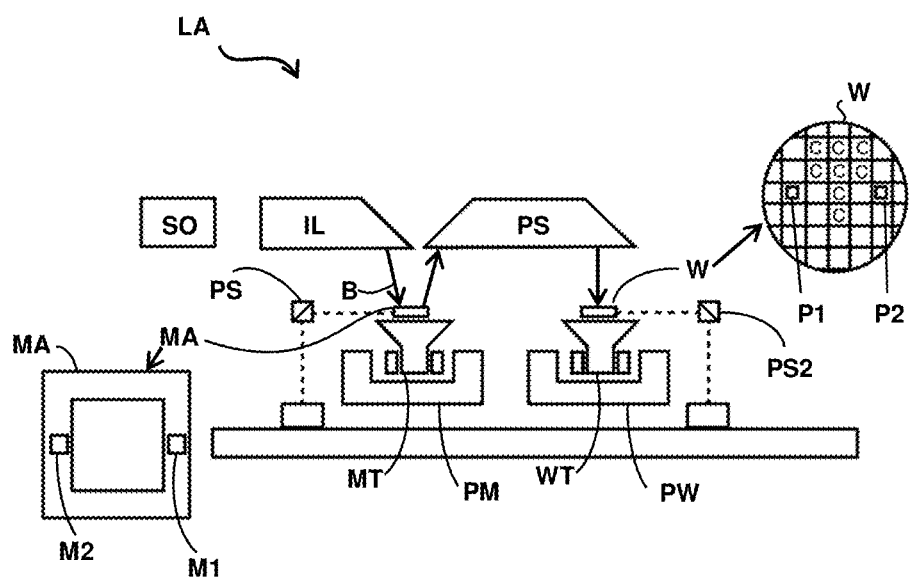
FIG. 15 is a schematic diagram of another lithographic projection apparatus according to an embodiment.

FIG. 15 schematically depicts another exemplary lithographic projection apparatus LA that includes:
- a source collector module SO to provide radiation.
- an illumination system (illuminator) IL configured to condition a radiation beam B (e.g. EUV radiation) from the source collector module SO.
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

As here depicted, the apparatus LA is of a reflective type (e.g. employing a reflective mask). It is to be noted that because most materials are absorptive within the EUV wavelength range, the patterning device may have multilayer reflectors comprising, for example, a multi-layer stack of molybdenum and silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 15, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 15, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors or a beam expander. In other cases the radiation source may be an integral part of the source collector module, for example when the radiation source is a discharge produced plasma EUV generator, often termed as a DPP radiation source.

The illuminator IL may comprise an adjuster for adjusting the angular intensity distribution of the radiation beam. Generally, at least the outer or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LA could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 16:
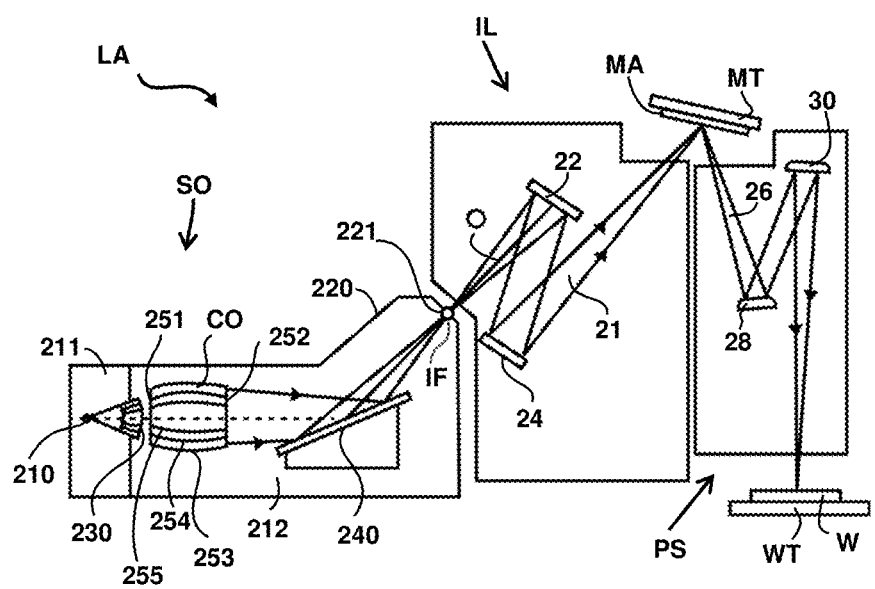
FIG. 16 is a more detailed view of the apparatus in FIG. 15 according to an embodiment.

FIG. 16 shows the apparatus LA in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma radiation source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line '0'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 16.

Collector optic CO, as illustrated in FIG. 16, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is desirably used in combination with a discharge produced plasma radiation source.

Figure 17:
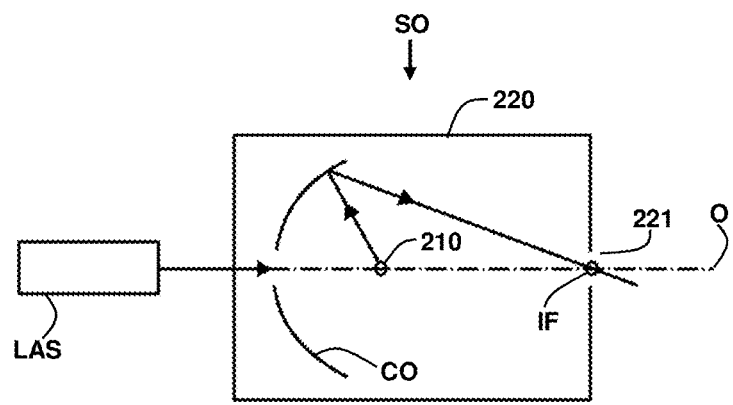
FIG. 17 is a more detailed view of the source collector module of the apparatus of FIG. 15 and FIG. 16 according to an embodiment.

Alternatively, the source collector module SO may be part of an LPP radiation system as shown in FIG. 17. A laser LAS is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses:

1. A method for determining a probabilistic model configured to predict a characteristic of a pattern on a substrate subjected to a patterning process, the method comprising:

obtaining a spatial map of a distribution of a residue corresponding to the characteristic of the pattern on the substrate;

determining, via a computing system, a zone of the spatial map based on a variation of the distribution of the residue within the spatial map; and determining, via the computing system, the probabilistic model based on the zone and the distribution of the residue values or the values of the characteristic of the pattern on the substrate within the zone.

2. The method of clause 1, wherein the determining the zone comprises:

determining whether the variation of the distribution of the residue exceeds a predefined threshold; and responsive to the exceeding of the predefined threshold, defining a different zone.

3. The method of clause 1 or clause 2, wherein the determining the zone is an iterative process, wherein a plurality of zones are obtained based on the variation of the distribution of the residue, such that a first zone of the plurality of zones has a first variation of the distribution of the residue, and a second zone of the plurality of zones has a second variation of the distribution of the residue.

4. The method of clause 3, wherein an iteration of the determining the zone comprises:

executing a classification algorithm with the spatial map of the distribution of the residue as input, the classification algorithm providing one or more groups of the residue based on the variation in residue; and identifying a boundary around each group of the one or more groups of residue, wherein the zone is a region within the boundary.

5. The method of clause 3 or clause 4, wherein the iteration of the determining the zone further comprises:

obtaining, via a metrology tool, metrology data in the first zone and the second zone corresponding to the characteristic of the pattern on the substrate, wherein the first zone and the second zone are separated by a first boundary between the first zone and the second zone, and the second zone is identified by a second boundary; and modifying the first boundary around the first zone of the residue based on the metrology data.

6. The method of clause 4, wherein the classification algorithm is a machine learning model trained to identify zones based on the variation of the distribution of the residue or the variation of the characteristic of the pattern on the printed substrate.

7. The method of any of clauses 4 to 6, wherein the classification algorithm involves a clustering analysis based on at least one of:

k-nearest mean;

mean-shifting;

naive-Bayes and back propagation neural network;

Density-Based Spatial Clustering of Applications with Noise;

Gaussian mixture model; or hierarchical clustering.

8. The method of any of clauses 1 to 7, wherein the determining the zone comprises:

determining a radial boundary and an angular span of the radial boundary based on the variation of the distribution of the residue exceeding a predefined threshold in the radial direction, an angular direction or a combination thereof.

9. The method of any of clauses 1 to 8, wherein the zone is defined in terms of radial distance from a center of the substrate.

10. The method of any of clauses 1 to 9, wherein the zone comprises an irregular closed boundary in a radial direction and spanning a certain angular region of the substrate.

11. The method of clauses 1 to 10, wherein the determining the probabilistic model comprises:

obtaining values of the characteristic of the pattern on the substrate within the zone; and determining statistical parameters of the probabilistic model based on values of the characteristic of the pattern or values of the residue corresponding to the characteristic of the pattern within the zone.

12. The method of clause 10, wherein the statistical parameters of the probabilistic model comprise a mean and standard deviation values.

13. The method of clause 11 or clause 12, wherein the probabilistic model is a Gaussian distribution.

14. The method of any of clauses 1 to 13, further comprising:

obtaining, via a metrology tool, additional metrology data corresponding to subsequently processed substrates and distribution of the residues corresponding to the additional data;

adjusting, via the computing system, the zone based on the distribution of the residues corresponding to the additional data; and adjusting, via the computing system, the probabilistic model based on the adjusted zone.

15. The method of clause 14, wherein the adjusting of the probabilistic model comprises adjusting a statistical parameter of the probabilistic model to improve accuracy of measurements.

16. The method of any of clauses 3 to 15, further comprising:

ordering, via the computing system, the plurality of zones from a highest value to a lowest value of the variation of the distribution of the residue within the spatial map; and guiding, via the computing system, the metrology tool to measure the characteristic of a pattern at different locations on a printed substrate based on the ordered plurality of zones.

17. The method of any of clauses 1 to 15, further comprising:

determining, via the computing system, the characteristics of the pattern on the printed substrate that are outside a specification based on the measurements from the metrology tool.

18. The method of any of clauses 1 to 17, wherein the characteristic is one or more selected from: a position relative to a substrate, a position relative to one or more other physical item instances, a geometric size, a geometric shape, a measure of a stochastic effect, and/or any combination selected therefrom.

19. The method of any of clauses 1 to 18, further comprising:

determining, via the computing system, an attribute of the distribution of the residue based on simulation data and measured data corresponding to the characteristic of an ensemble of physical items.

20. The method of clause 19, wherein the attribute of the distribution of the residue with respect to the ensemble of physical items comprises a cumulative distribution function for the ensemble of physical item instances.

21. The method of any of clauses 18 to 20, wherein the physical item instance corresponds to a pattern instance on a substrate produced by a device manufacturing process.

22. The method of any of clauses 18 to 21, further comprising:

determining, based on the probability determined by probabilistic model, or the adjusted probabilistic model, the predicted presence of at least one physical item instance out of specification in a measurement location or field of view of a metrology tool.

23. The method of any of clauses 1 to 22, further comprising:

determining, based on the probability determined by probabilistic model, or the adjusted probabilistic model, a sampling plan comprising measurement locations on a substrate for measurements of a characteristic to determine physical item instances, if any, that are out of specification.

24. A method for determining, for a metrology tool, a sampling plan of a patterning process, the method comprising:

obtaining a probabilistic model corresponding to a zone of a substrate;

predicting, via a computing system, a probability using the probabilistic model; and determining, via the computing system, based on the probability, a sampling plan comprising measurement locations on the substrate for measurements of a characteristic to determine whether the substrate is out of specification.

25. The method of clause 24, further comprising:

obtaining a spatial map of a distribution of a residue corresponding to a characteristic of a pattern on the substrate;

obtaining a plurality of zones of the substrate based on the distribution of the residue and based on a probabilistic model per zone of the plurality of zones; and ordering, via the computing system, the plurality of zones such that a zone of the plurality of zones is arranged in a descending order based on associated values of the variation of the distribution of the residue within the spatial map, wherein the determining of the sampling plan is based on the ordering of the plurality of zones and the probability predicted by the probabilistic model corresponding to a given zone.

26. The method of clause 24 or clause 25, further comprising:

guiding, based on the sampling plan, the metrology tool to measure a characteristic of a pattern at different locations on the substrate produced by the patterning process.

27. The method of clause 25 or clause 26, wherein the determining the sampling plan comprises:

obtaining, via the metrology tool, additional metrology data corresponding to subsequently processed substrates and distribution of the residues corresponding to the additional data;

adjusting, via the computing system, a given zone of the plurality of zones based on the distribution of the residues corresponding to the additional data;

adjusting, via the computing system, the probabilistic model based on the adjusted zone; and adjusting, via the computing system, the sampling plan based on a probability determined based on the adjusted probabilistic model.

28. The method of clause 27, wherein the adjusting of the probabilistic model comprises adjusting a statistical parameter of the probabilistic model to improve accuracy of measurements.

29. A method for determining zones of a substrate based on process variability of a patterning process, the method comprising:

obtaining (i) a spatial map of a distribution of a residue corresponding to a characteristic of a pattern on a substrate, and (ii) a process variation of a parameter of the patterning process;

detecting, via a computing system, a relationship between the spatial map of the distribution of the residue and the process variation of the parameter of the patterning process;

determining, via the computing system, a zone based on the relationship; and determining, via the computing system, the probabilistic model based on the zone and the distribution of the residue values or the values of the characteristic of the pattern on the substrate within the zone.

30. The method of clause 29, wherein the determining the zone comprises:

determining, based on the relationship, whether the process variation of the parameter of the patterning process causes a change in the distribution of the residue to exceed a predefined threshold; and responsive to the exceeding of the predefined threshold, defining a different zone.

31. The method of clause 30, wherein the parameter of the patterning process is at least one of dose, focus, an optical parameter, or moving standard deviation of movement of the substrate.

32. A computer program product comprising a non-transitory computer readable medium having instructions recorded thereon, the instructions when executed by a computer system implementing the method of any of clauses 1 to 31.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although specific reference may be made in this text to the use of embodiments in the manufacture of ICs, it should be understood that the embodiments herein may have many other possible applications. For example, it may be employed in the manufacture of integrated optical systems, guidance and detection patterns for magnetic domain memories, liquid-crystal displays (LCDs), thin film magnetic heads, micromechanical systems (MEMs), etc. The skilled artisan will appreciate that, in the context of such alternative applications, any use of the terms "reticle", "wafer" or "die" herein may be considered as synonymous or interchangeable with the more general terms "patterning device", "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create, for example, a multi-layer IC, so that the term substrate used herein may also refer to a substrate that already contains multiple processed layers.

In the present document, the terms "radiation" and "beam" as used herein encompass all types of electromagnetic radiation, including ultraviolet radiation (e.g. with a wavelength of about 365, about 248, about 193, about 157 or about 126 nm) and extreme ultra-violet (EUV) radiation (e.g. having a wavelength in the range of 5-20 nm), as well as particle beams, such as ion beams or electron beams.

The terms "optimizing" and "optimization" as used herein refers to or means adjusting a patterning apparatus (e.g., a lithography apparatus), a patterning process, etc. such that results or processes have more desirable characteristics, such as higher accuracy of projection of a design pattern on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

Aspects of the invention can be implemented in any convenient form. For example, an embodiment may be implemented by one or more appropriate computer programs which may be carried on an appropriate carrier medium which may be a tangible carrier medium (e.g. a disk) or an intangible carrier medium (e.g. a communications signal). Embodiments of the invention may be implemented using suitable apparatus which may specifically take the form of a programmable computer running a computer program arranged to implement a method as described herein. Thus, embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, these inventions have been grouped into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary sections of the present document should be taken as containing a comprehensive listing of all such inventions or all aspects of such inventions.

It should be understood that the description and the drawings are not intended to limit the present disclosure to the particular form disclosed, but to the contrary, the intention is to cover all modifications, equivalents, and alternatives falling within the spirit and scope of the inventions as defined by the appended claims.

Modifications and alternative embodiments of various aspects of the inventions will be apparent to those skilled in the art in view of this description. Accordingly, this description and the drawings are to be construed as illustrative only and are for the purpose of teaching those skilled in the art the general manner of carrying out the inventions. It is to be understood that the forms of the inventions shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." As used herein, unless specifically stated otherwise, the term "or" encompasses all possible combinations, except where infeasible. For example, if it is stated that a database can include A or B, then, unless specifically stated otherwise or infeasible, the database can include A, or B, or A and B. As a second example, if it is stated that a database can include A, B, or C, then, unless specifically stated otherwise or infeasible, the database can include A, or B, or C, or A and B, or A and C, or B and C, or A and B and C. Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every. References to selection from a range includes the end points of the range.

In the above description, any processes, descriptions or blocks in flowcharts should be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

While certain embodiments have been described, these embodiments have been presented by way of example only, and are not intended to limit the scope of the present disclosures. Indeed, the novel methods, apparatuses and systems described herein can be embodied in a variety of other forms; furthermore, various omissions, substitutions and changes in the form of the methods, apparatuses and systems described herein can be made without departing from the spirit of the present disclosures. The accompanying claims and their equivalents are intended to cover such forms or modifications as would fall within the scope and spirit of the present disclosures.

The invention claimed is:

1. A method comprising:
obtaining a spatial map of a distribution of a residue corresponding to a characteristic of a pattern on a substrate subjected to a patterning process;
determining, by a hardware computing system, a zone of the spatial map based on a variation of the distribution of the residue within the spatial map; and
determining, by the hardware computing system and based on the zone and the distribution of the residue values or the values of the characteristic of the pattern on the substrate within the zone, a probabilistic model configured to predict the characteristic.

2. The method of claim 1, wherein the determining the zone comprises:
determining that the variation of the distribution of the residue exceeds a certain threshold; and
responsive to the variation of the distribution of the residue exceeding the threshold, defining a different zone.

3. The method of claim 1, wherein the determining the zone is an iterative process, wherein a plurality of zones are obtained based on the variation of the distribution of the residue, such that a first zone of the plurality of zones has a first variation of the distribution of the residue, and a second zone of the plurality of zones has a second variation of the distribution of the residue.

4. The method of claim 3, wherein an iteration of the determining the zone comprises:
executing a classification algorithm with the spatial map of the distribution of the residue as input, the classification algorithm providing one or more groups of the residue based on the variation in residue; and
identifying a boundary around each group of the one or more groups of residue, wherein the zone is a region within the boundary.

5. The method of claim 4, wherein the classification algorithm is a machine learning model trained to identify zones based on the variation of the distribution of the residue or the variation of the characteristic of the pattern on the substrate.

6. The method of claim 4, wherein the classification algorithm involves a clustering analysis based on at least one selected from:
k-nearest mean;
mean-shifting;
naive-Bayes and back propagation neural network;
Density-Based Spatial Clustering of Applications with Noise;
Gaussian mixture model; or
hierarchical clustering.

7. The method of claim 3, wherein the iteration of the determining the zone further comprises:
obtaining, via a metrology tool, metrology data in the first zone and the second zone corresponding to the characteristic of the pattern on the substrate, wherein the first zone and the second zone are separated by a first boundary between the first zone and the second zone, and the second zone is identified by a second boundary; and
modifying the first boundary around the first zone of the residue based on the metrology data.

8. The method of claim 1, wherein the determining the zone comprises determining a radial boundary and an angular span of the radial boundary based on the variation of the distribution of the residue exceeding a certain threshold in the radial direction, an angular direction or both.

9. The method of claim 1, wherein the zone is defined in terms of radial distance from a center of the substrate.

10. The method of claim 1, wherein the zone comprises an irregular closed boundary in a radial direction and spanning a certain angular region of the substrate.

11. The method of claim 1, wherein the determining the probabilistic model comprises:
obtaining values of the characteristic of the pattern on the substrate within the zone; and
determining statistical parameters of the probabilistic model based on values of the characteristic of the pattern or values of the residue corresponding to the characteristic of the pattern within the zone.

12. The method of claim 11, wherein the statistical parameters of the probabilistic model comprise a mean value and a standard deviation value.

13. The method of claim 11, wherein the probabilistic model is a Gaussian distribution.

14. The method of claim 1, further comprising:
obtaining, via a metrology tool, additional metrology data corresponding to subsequently processed substrates and distribution of the residues corresponding to the additional data;
adjusting, via the computing system, the zone based on the distribution of the residues corresponding to the additional data; and
adjusting, via the computing system, the probabilistic model based on the adjusted zone.

15. A computer program product comprising a non-transitory computer readable medium having instructions therein, the instructions, upon execution by a computer system, configured to cause the computer system to at least:
obtain a spatial map of a distribution of a residue corresponding to a characteristic of a pattern on a substrate subjected to a patterning process;
determine a zone of the spatial map based on a variation of the distribution of the residue within the spatial map; and
determine, based on the zone and the distribution of the residue values or the values of the characteristic of the pattern on the substrate within the zone, a probabilistic model configured to predict the characteristic.

16. The computer program product of claim 15, wherein the instructions configured to cause the computer system to determine the zone are further configured to cause the computer system to:
determine that the variation of the distribution of the residue exceeds a certain threshold; and
responsive to the variation of the distribution of the residue exceeding the threshold, define a different zone.

17. The computer program product of claim 15, wherein the instructions configured to cause the computer system to determine the zone are further configured to cause the computer system to determine the zone in an iterative process, wherein a plurality of zones are obtained based on the variation of the distribution of the residue, such that a first zone of the plurality of zones has a first variation of the distribution of the residue, and a second zone of the plurality of zones has a second variation of the distribution of the residue.

18. The computer program product of claim 17, wherein the instructions configured to cause the computer system to determine the zone are further configured to cause the computer system to, for an iteration of the determination of the zone:
   execute a classification algorithm with the spatial map of the distribution of the residue as input, the classification algorithm providing one or more groups of the residue based on the variation in residue; and
   identify a boundary around each group of the one or more groups of residue, wherein the zone is a region within the boundary.

19. The computer program product of claim 17, wherein the instructions configured to cause the computer system to determine the zone are further configured to cause the computer system to, for an iteration of the determination of the zone:
   obtain metrology data, determined by a metrology tool, in the first zone and the second zone corresponding to the characteristic of the pattern on the substrate, wherein the first zone and the second zone are separated by a first boundary between the first zone and the second zone, and the second zone is identified by a second boundary; and
   modify the first boundary around the first zone of the residue based on the metrology data.

20. The computer program product of claim 15, wherein the instructions configured to cause the computer system to determine the zone are further configured to cause the computer system to determine a radial boundary and an angular span of the radial boundary based on the variation of the distribution of the residue exceeding a certain threshold in the radial direction, an angular direction or both.

* * * * *